(12) United States Patent
Nakano et al.

(10) Patent No.: US 6,515,920 B2
(45) Date of Patent: Feb. 4, 2003

(54) SEMICONDUCTOR DATA STORING CIRCUIT DEVICE, METHOD OF CHECKING THE DEVICE AND METHOD OF RELIEVING THE DEVICE FROM DEFECTIVE CELL

(75) Inventors: Hirofumi Nakano, Tokyo (JP); Atsushi Miyanishi, Tokyo (JP); Sizuo Morizane, Tokyo (JP)

(73) Assignee: Mitsubishi Denki Kabushiki Kaisha, Chiyoda-ku (JP)

( * ) Notice: Subject to any disclaimer, the term of this patent is extended or adjusted under 35 U.S.C. 154(b) by 0 days.

(21) Appl. No.: 09/970,708

(22) Filed: Oct. 5, 2001

(65) Prior Publication Data

US 2002/0110027 A1 Aug. 15, 2002

(30) Foreign Application Priority Data

Feb. 9, 2001 (JP) .................................. 2001-034411

(51) Int. Cl.[7] ................................................ G11C 7/00
(52) U.S. Cl. .............. 365/200; 365/189.01; 365/230.01
(58) Field of Search ................................. 365/200, 201, 365/230.01, 230.02, 63, 52, 230.08, 189.01, 230.06

(56) References Cited

U.S. PATENT DOCUMENTS 6,111,807 A * 8/2000 Ooishi ................... 365/230.01
6,272,056 B1 * 8/2001 Ooishi ........................ 365/200

FOREIGN PATENT DOCUMENTS

| JP | 5-314794 | 11/1993 |
| JP | 6-267298 | 9/1994 |

* cited by examiner

Primary Examiner—David Nelms
Assistant Examiner—Gere N. Auduong
(74) Attorney, Agent, or Firm—Burns, Doane, Swecker & Mathis, LLP

(57) ABSTRACT

A memory core of a semiconductor data storing circuit device in a semiconductor chip is composed of a memory cell array having memory cells of rows and columns, data input/output circuits of a normal operation in which a data input line and a data output line for one bit of data are arranged at every four columns of the memory cell array, and checking circuits of a test operation in which a test data input line and a test data output line for one bit of test data are arranged at every eight (or two) columns of the memory cell array. In cases where the test data input/output lines for one bit of test data are arranged at every eight columns, because the number of test data input/output lines is lower than the number of data input/output lines, the number of input/output pins for the test operation can be reduced. Also, in cases where the test data input/output lines for one bit of test data are arranged at every two columns, because the number of test data input/output lines is higher than the number of data input/output lines, the number of memory cells simultaneously checked is increased, and a test operation time in the manufacturing of the memory cell array can be shortened.

20 Claims, 22 Drawing Sheets

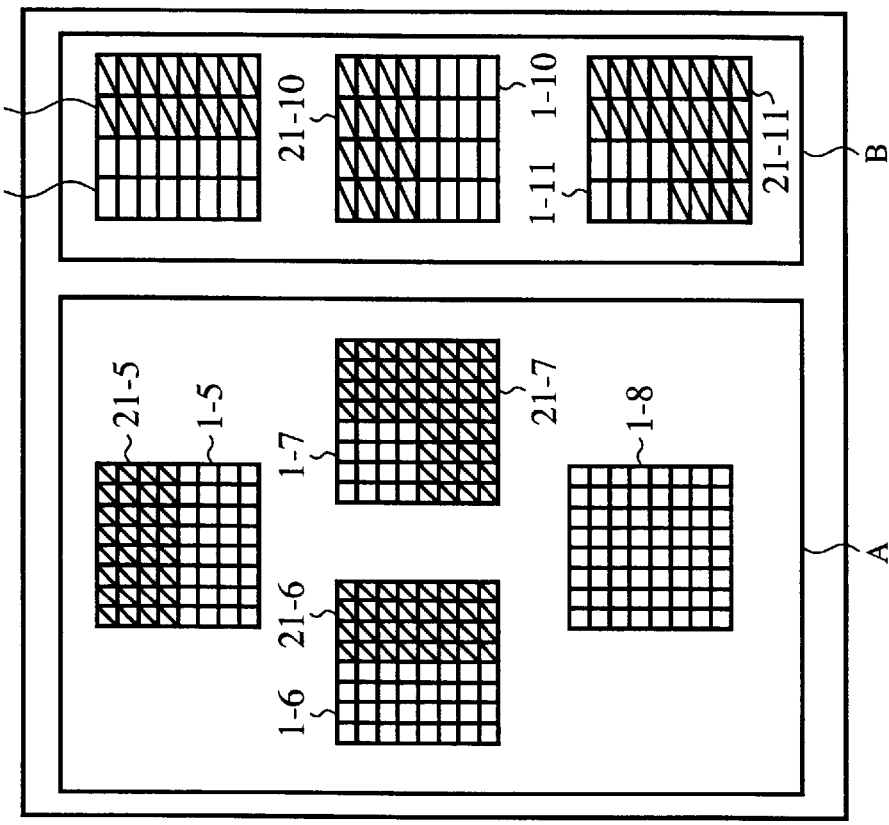
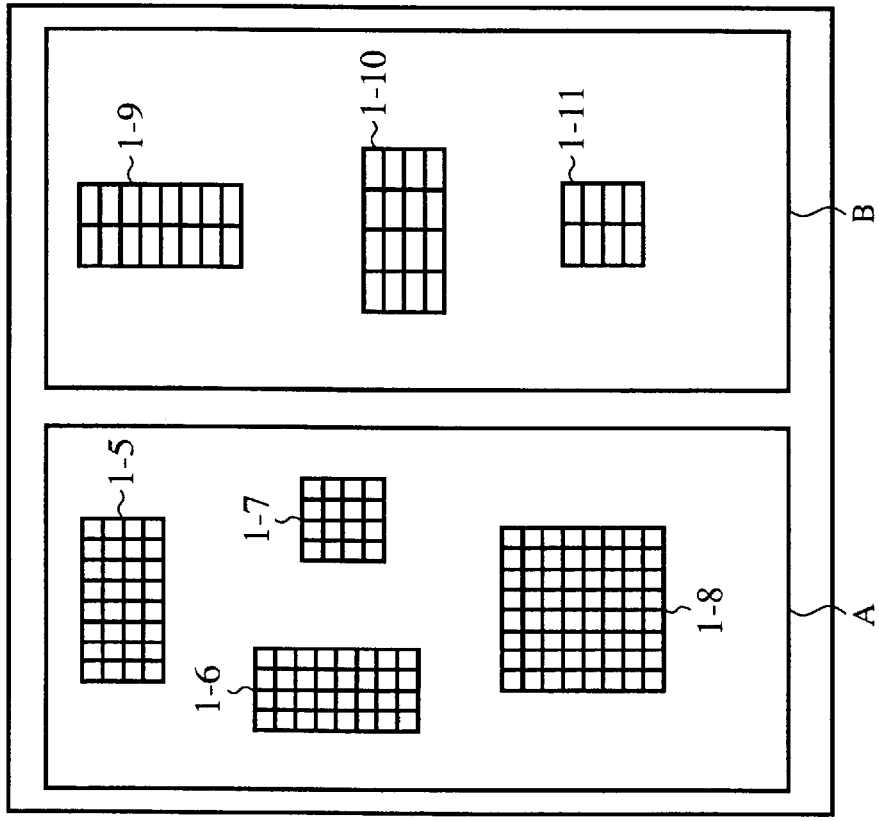

FIG.14
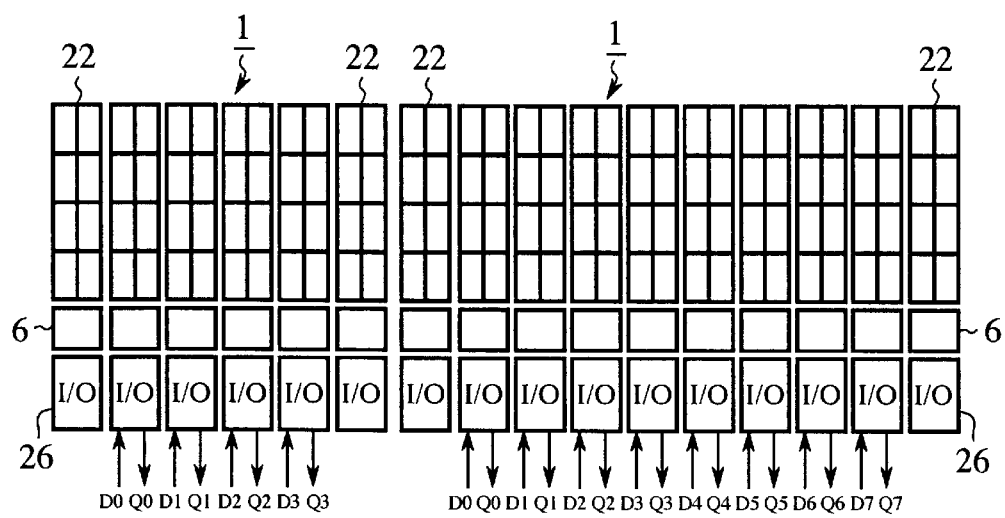
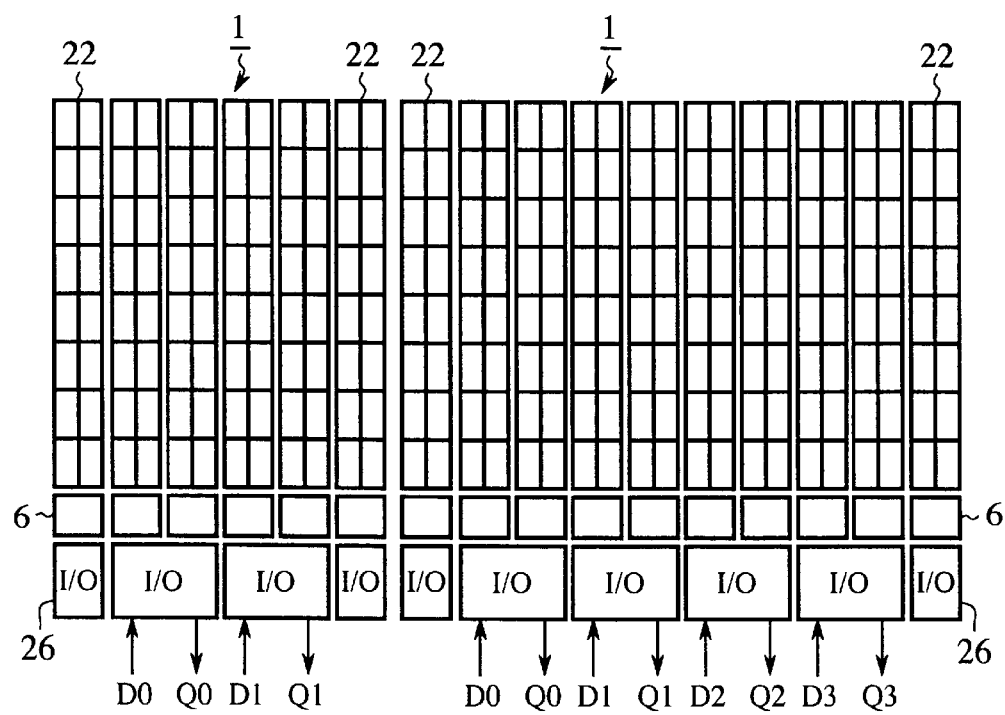

FIG.22A (PRIOR ART)

| 14 | 15 | 14 | 15 | 14 | 15 | 14 | 15 |
|---|---|---|---|---|---|---|---|
| 12 | 13 | 12 | 13 | 12 | 13 | 12 | 13 |
| 10 | 11 | 10 | 11 | 10 | 11 | 10 | 11 |
| 8 | 9 | 8 | 9 | 8 | 9 | 8 | 9 |
| 6 | 7 | 6 | 7 | 6 | 7 | 6 | 7 |
| 4 | 5 | 4 | 5 | 4 | 5 | 4 | 5 |
| 2 | 3 | 2 | 3 | 2 | 3 | 2 | 3 |
| 0 | 1 | 0 | 1 | 0 | 1 | 0 | 1 |

0-TH BIT | FIRST BIT | SECOND BIT | THIRD BIT

FIG.22B (PRIOR ART)

| 28 | 29 | 30 | 31 | 28 | 29 | 30 | 31 |
|---|---|---|---|---|---|---|---|
| 24 | 25 | 26 | 27 | 24 | 25 | 26 | 27 |
| 20 | 21 | 22 | 23 | 20 | 21 | 22 | 23 |
| 16 | 17 | 18 | 19 | 16 | 17 | 18 | 19 |
| 12 | 13 | 14 | 15 | 12 | 13 | 14 | 15 |
| 8 | 9 | 10 | 11 | 8 | 9 | 10 | 11 |
| 4 | 5 | 6 | 7 | 4 | 5 | 6 | 7 |
| 0 | 1 | 2 | 3 | 0 | 1 | 2 | 3 |

0-TH BIT | FIRST BIT

FIG.22C (PRIOR ART)

| 56 | 57 | 58 | 59 | 60 | 61 | 62 | 63 |
|---|---|---|---|---|---|---|---|
| 48 | 49 | 50 | 51 | 52 | 53 | 54 | 55 |
| 40 | 41 | 42 | 43 | 44 | 45 | 46 | 47 |
| 32 | 33 | 37 | 35 | 36 | 37 | 38 | 39 |
| 24 | 25 | 26 | 27 | 28 | 29 | 30 | 31 |
| 16 | 17 | 18 | 19 | 20 | 21 | 22 | 23 |
| 8 | 9 | 10 | 11 | 12 | 13 | 14 | 15 |
| 0 | 1 | 2 | 3 | 4 | 5 | 6 | 7 |

0-TH BIT

SEMICONDUCTOR DATA STORING CIRCUIT DEVICE, METHOD OF CHECKING THE DEVICE AND METHOD OF RELIEVING THE DEVICE FROM DEFECTIVE CELL

BACKGROUND OF THE INVENTION

1. Field of the Invention

The present invention relates to a semiconductor data storing circuit device, a method of checking the semiconductor data storing circuit device and a method of relieving the semiconductor data storing circuit device from a defective cell.

2. Description of Related Art

FIG. 19 is a block diagram showing the configuration of a system LSI in which a plurality of static random access memory (SRAM) cores are arranged. The system LSI denotes an example of a conventional semiconductor data storing circuit device. In FIG. 19, 101 indicates a semiconductor chip, 102 indicates each of a plurality of pads, 103 indicates each of a plurality of memory cores (SRAM cores), 104 indicates each of a plurality of logical circuits, and 105 indicates each of a plurality of selecting circuits. Each selecting circuit 105 selects either one logical circuit 104 or a terminal 202 to be used for a test operation.

FIG. 20 is a block diagram showing the configuration of each memory core 103 shown in FIG. 19. In FIG. 20, 106 indicates a memory cell array having 8×16 memory cells arranged in 8 rows and 16 columns. 106a indicates each of 128 (8×16) memory cells (hereinafter, called cells). 106b indicates each of 16 bit lines. 106c indicates each of 8 word lines. 107 indicates a row decoder. 108 indicates each of a plurality of precharge circuits. 109 indicates a column decoder. 110 indicates another column decoder. 111 indicates each of eight multiplexers of one-input (or one-output) and two-output (or two-input). The multiplexer 111 is arranged at every two columns. 112 indicates each of four demultiplexers of one-input and two-output. The demultiplexer 112 is arranged at every four columns. 113 indicates each of four multiplexers of two-input and one-output. The multiplexer 113 is arranged at every four columns. 114 indicates eight sense amplifiers respectively arranged at every two columns. 115 indicates eight write drivers respectively arranged at every two columns. 116 indicates each of four input buffers respectively arranged at every four columns. 117 indicates each of four output buffers respectively arranged at every four columns. D0, D1, D2 and D3 indicate four data input pins. Each data input pin is arranged at every four columns. Q0, Q1, Q2 and Q3 indicate four data output pins. Each data output pin is arranged at every four columns.

Therefore, the memory cell array 106 has a cell configuration of 8 rows and 16 columns. Also, because each bit of the input/output data corresponds to four columns, the memory cell array 106 has a cell configuration of 32 words and 4 bits.

Next, an operation of the memory core 103 will be described below.

A plurality of specific rows are specified by a row address signal input to the row decoder 107, and a plurality of specific columns are specified according to a column address signal input to the column decoders 109 and 110. Thereafter, in a write mode operation, four bits of data input to the corresponding data input pins D0, D1, D2 and D3 are written in four specific cells arranged in the specific rows and the specific columns respectively through the corresponding input buffers 116, the corresponding demultiplexers 112, the corresponding write drivers 115 and the corresponding multiplexers 111. In contrast, in a read mode operation, four bits of data stored in four specific cells of the specific rows and the specific columns are read out as four bits of test data to the corresponding data output pins Q0, Q1, Q2 and Q3 through the corresponding multiplexers 111, the corresponding sense amplifiers 114, the corresponding multiplexers 113 and the corresponding output buffers 117, and the bits of test data are output from the corresponding data output pins Q0, Q1, Q2 and Q3.

FIG. 21 is a block diagram showing the configuration of each memory core 103 in which a checking circuit is arranged. In FIG. 21, 118 indicates each of 4 multiplexers of two-input and one-output. The multiplexer 118 is arranged at every four columns. 119 indicates each of four demultiplexers of one-input and two-output. The demultiplexer 119 is arranged at every four columns. 120 indicates a controller. 121a indicates a column address selector. 121b indicates another column address selector. 122 indicates a row address selector. TD0, TD1, TD2 and TD3 indicate four test data input pins. TQ0, TQ1, TQ2 and TQ3 indicate four test data output pins. The other constituent elements, which are the same as those shown in FIG. 20, are indicated by the same reference numerals as those shown in FIG. 20.

Next, an operation of the memory core 103 shown in FIG. 21 will be described below.

In cases where an operation mode changing signal input to the controller 120 indicates a normal operation mode, each multiplexer 118 is connected with the corresponding data input pin D0, D1, D2 or D3, each of the column address selectors 121a and 121b selects a column address signal, and the row address selector 122 selects a row address signal. Therefore, the same operation as that performed in the memory core 103 shown in FIG. 20 is performed in each of the write and read modes.

In contrast, in cases where an operation mode changing signal input to the controller 120 indicates a test operation mode, each multiplexer 118 is connected with the corresponding test data input pin TD0, TD1, TD2 or TD3, each of the column address selectors 121a and 121b selects a test column address signal, and the row address selector 122 selects a test row address signal.

In this case, a plurality of specific rows are specified according to a test row address signal input to the row decoder 107, and a plurality of specific columns are specified by a test column address signal input to the column decoders 109 and 110. Thereafter, in a write mode operation, four bits of data input to the test data input pins TD0, TD1, TD2 and TD3 are written in four specific cells of the specific rows and the specific columns through the corresponding input buffers 116, the corresponding multiplexers 118, the corresponding demultiplexers 112, the corresponding write drivers 115 and the corresponding multiplexers 111. In contrast, in a read mode operation, four bits of data stored in four specific cells of the specific rows and the specific columns are read out from the corresponding test data output pins TQ0, TQ1, TQ2 and TQ3 through the corresponding multiplexers 111, the corresponding sense amplifiers 114, the corresponding multiplexers 113, the corresponding demultiplexers 119 and the corresponding output buffers 117.

Therefore, in cases where the test operation mode is performed in each memory core 103 shown in FIG. 21, the memory cell array 106 has a cell configuration of 16 columns×8 rows in the same manner as that in the normal operation mode. Also, because each bit of the input/output test data corresponds to four columns, the memory cell array 106 has a cell configuration of 32 words×4 bits. Therefore, an operation check for each memory core 103 is performed according to a checking program applied to a cell configuration of 32 words×4 bits in the manufacturing of the system LSI.

Because the semiconductor data storing circuit device (or the system LSI) arranged on a semiconductor chip has the above configuration, in cases where a large number of input/output pins are arranged in the device, a problem has arisen that it is difficult to arrange a plurality of test input/output pins corresponding to the input/output pins.

Also, in cases where a large number of columns correspond to each bit of data input or output in the normal operation mode, another problem has arisen that a test operation time is lengthened so as to increase a manufacturing cost of the device.

Also, in cases where word-bit configurations of the memory cores 103 in the semiconductor data storing circuit device differs from each other, it is required to prepare a checking program for each memory core of the semiconductor data storing circuit device. Therefore, another problem has arisen that the test operation cannot be efficiently performed and the checking cost is increased. In detail, even though all memory cell arrays arranged in one semiconductor data storing circuit device respectively have the same 64-cell configuration of 8 columns×8 rows, there is a case where the memory cell arrays have a plurality of word-bit configurations such as 16 words×4 bits, 32 words×2 bits and 64 words×1 bit. In this case, a physical position of a cell depends on the word-bit configuration. For example, a position of a defective cell indicated by "0-th bit and tenth address" in FIG. 22A, a position of a defective cell indicated by "0-th bit and tenth address" in FIG. 22B and a position of a defective cell indicated by "0-th bit and tenth address" in FIG. 22C differ from each other. Because the position of a defective cell depends on the word-bit configuration, a checking algorithm corresponding to each word-bit configuration of the memory cell array 106 is required. Also, a method of relieving the memory cell array 106 from a defective cell is required for each word-bit configuration of the memory cell array 106.

Also, in cases where a plurality of memory cores having cell configurations, in which combinations of the numbers of columns and the numbers of rows differ from each other, are arranged in the semiconductor data storing circuit device, it is required to prepare a plurality of checking programs to perform the test operation of the semiconductor data storing circuit device. Therefore, a further problem of increases in ckecking costs has arisen.

Also, in cases where a plurality of types of memory cores are arranged in the semiconductor data storing circuit device and the cell configurations in each type of memory cores differ from each other, a large number of checking programs are required to perform the test operation for the types of memory cores of the semiconductor data storing circuit device. Therefore, a yet further problem of increases in ckecking costs has arisen.

Also, because the semiconductor data storing circuit device has the above configuration shown in FIG. 20 and FIG. 21, in cases where a spare memory cell array is additionally arranged in a memory core to relieve a memory cell array of the memory core from a defective cell of the memory cell array, another problem has arisen that a test operation of the spare memory cell array cannot be performed in advance before the relief of the memory cell array.

Also, in cases where a failure occurs in a cell of a memory cell array due to an operation speed of the memory cell array, another problem has arisen that there is no guarantee that the memory cell array is relieved from a defective cell by using a spare memory cell array.

Also, in cases where a plurality of memory cell arrays having cell configurations different from each other are arranged in a memory core of the semiconductor data storing circuit device, the number of rows and the number of columns in each memory cell array differ from those in the other memory cell arrays. In this case, when a plurality of spare memory cell arrays are arranged in the memory core to relieve a specific memory cell array from a defective cell of the specific memory cell array arranged in the memory core, another problem has arisen that the processing from the operation check of the memory cell arrays and the spare memory cell arrays to the relief of each memory cell array is complicated and the semiconductor data storing circuit device cannot be efficiently manufactured.

SUMMARY OF THE INVENTION

A main object of the present invention is to provide, with due consideration to the drawbacks of the conventional semiconductor data storing circuit device, a semiconductor data storing circuit device and a method of checking the device in which the number of test data input/output pins (or lines) required for a test operation of a memory cell array in the manufacturing of the memory cell array is reduced.

Also, a first subordinate object of the present invention is to provide a semiconductor data storing circuit device and a method of checking the device in which the duration of a test operation required for a test operation of a memory cell array in the manufacturing of the memory cell array is shortened.

Also, a second subordinate object of the present invention is to provide a semiconductor data storing circuit device and a method of checking the device in which a test operation of a plurality of memory cell arrays is performed according to one checking program even though word-bit configurations of the memory cell arrays differ from each other.

Also, a third subordinate object of the present invention is to provide a semiconductor data storing circuit device and a method of checking the device in which a test operation is performed for a plurality of memory cell arrays arranged in a chip according to one checking program even though a combination of the number of rows and the number of columns in each memory cell array differs from those in the other memory cell arrays.

Also, a fourth subordinate object of the present invention is to provide a semiconductor data storing circuit device and a method of checking the device in which a test operation is performed for a plurality of memory cell arrays of each type of memory core according to one checking program in cases where a plurality of types of memory cores are arranged in a semiconductor chip and combinations of the numbers of rows and the numbers of columns of the memory cell arrays in each type of memory cores differ from each other.

Also, a fifth subordinate object of the present invention is to provide a semiconductor data storing circuit device and a method of relieving the device from a defective memory cell in which a memory cell array of a memory core is efficiently relieved from a defective memory cell existing in the memory cell array even though a spare memory cell array is arranged in the memory core.

Also, a sixth subordinate object of the present invention is to provide a semiconductor data storing circuit device and a method of relieving the device from a defective memory cell in which the processing from a test operation for a plurality of memory cell arrays placed on a semiconductor chip to the relief of each memory cell array from a defective memory cell existing in the memory cell array is efficiently performed by using a plurality of spare memory cell arrays placed with the memory cell arrays in the semiconductor chip even though a combination of the number of rows and the number of columns in each memory cell array differs from those in the other memory cell arrays.

The main object or the first subordinate object is achieved by the provision of a semiconductor data storing circuit device, comprising a memory cell array which is arranged in a memory core of a semiconductor chip and has a plurality of memory cells arranged in a row or a plurality of rows and a plurality of columns, a data input/output circuit which is arranged in the memory core to be used in a normal operation of the memory cell array and in which a data input line or/and a data output line for each bit of data is/are arranged at every first predetermined number of columns of the memory cell array, and a checking circuit which is arranged in the memory core to be used in a test operation performed in manufacturing of the memory cell array and in which a test data input line or/and a test data output line for each bit of test data is/are arranged at every second predetermined number of columns of the memory cell array on condition that the second predetermined number of columns differs from the first predetermined number of columns.

Accordingly, the number of test data input/output lines can be reduced in cases where the second predetermined number of columns is higher than the first predetermined number of columns, and a time required for the test operation in the manufacturing of the memory cell array can be shortened in cases where the second predetermined number of columns is lower than the first predetermined number of columns.

It is preferred that the second predetermined number of columns corresponding to the test data input line or/and the test data output line of the checking circuit is higher than the first predetermined number of columns corresponding to the data input line or/and the data output line of the data input/output circuit.

Accordingly, the number of test data input/output lines can be reduced.

It is preferred that the second predetermined number of columns corresponding to the test data input line or/and the test data output line of the checking circuit is lower than the first predetermined number of columns corresponding to the data input line or/and the data output line of the data input/output circuit.

Accordingly, because the number of memory cells simultaneously checked is increased, a time required for the test operation in the manufacturing of the memory cell array can be shortened.

The second, third or fourth subordinate object is achieved by the provision of a semiconductor data storing circuit device, which has a plurality of memory cores on a semiconductor chip, comprising a memory cell array which is arranged in each memory core and has a plurality of memory cells arranged in a row or a plurality of rows and a plurality of columns, a data input/output circuit which is arranged in each memory core to be used in a normal operation of the memory cell array of the memory core and in which a data input line or/and a data output line for each bit of data is/are arranged at columns defined by an arbitrary number of the memory cell array, and a checking circuit which is arranged in each memory core to be used in a test operation performed in manufacturing of the memory cell array of the memory core and in which a test data input line or/and a test data output line for each bit of test data is/are arranged at every predetermined number of columns of the memory cell array on condition that the predetermined number of columns is common to the memory cores regardless of the arbitrary number of columns corresponding to the data input line or/and the data output line for each bit of data in the data input/output circuit of the memory core.

Accordingly, the test operation can be performed by using one checking program.

It is preferred that the number of rows and the number of columns in the memory cell array of each memory core are the same as those in the memory cell arrays of the other memory cores, and the arbitrary number of columns corresponding to the data input line or/and the data output line for each bit of data in the data input/output circuit of each memory core differs from the arbitrary number of columns in the data input/output circuits of the other memory cores.

Accordingly, even though a bit-word configuration of the memory cell array in one memory core differs from those in the other memory cores in cases where combinations of the numbers of rows and the numbers of columns in the memory cell arrays of the memory cores are the same as each other, the test operation for the memory cell arrays can be performed by using one checking program.

It is preferred that a combination of the number of rows and the number of columns in the memory cell array of each memory core differs from combinations of the numbers of rows and the numbers of columns in the memory cell arrays of the other memory cores.

Accordingly, the test operation for the memory cores can be performed by using one checking program by adding a virtual memory cell array to each memory cell array to make all memory cell arrays have the same column number and the same row number.

It is preferred that the memory cores are classified into a plurality of types of memory cores, a combination of the number of rows and the number of columns in the memory cell array of each memory core of one type differs from combinations of the numbers of rows and the numbers of columns in the memory cell arrays of the other memory cores of the type for each type of memory cores, the data input line or/and the data output line for each bit of data is/are arranged at every arbitrary number of columns of the memory cell array in each data input/output circuit of one type of memory cores for each type of memory cores, and the test data input line or/and the test data output line for each bit of test data is/are arranged in each checking circuit of one type of memory cores every predetermined number of columns of the memory cell array for each type of memory cores on condition that the predetermined number of columns is common to one type of the memory cores regardless of the arbitrary number of columns in the corresponding data input/output circuit for each type of memory cores.

Accordingly, in cases where a virtual memory cell array is added to each memory cell array to make all memory cell arrays have the maximum column number and the maximum row number for each type of memory cores, the test operation for the memory cores can be performed by using one checking program for each type of memory cores.

The fifth subordinate object is achieved by the provision of a semiconductor data storing circuit device, comprising, a memory cell array which is arranged in a memory core of a semiconductor chip and has a plurality of memory cells arranged in a row or a plurality of rows and a plurality of columns, a data input/output circuit which is arranged in the memory core to be used in a normal operation of the memory cell array and in which a data input line or/and a data output line for each bit of data is/are arranged at every first predetermined number of columns of the memory cell array, a checking circuit which is arranged in the memory core to be used in a test operation performed in manufacturing of the memory cell array and in which a test data input line or/and a test data output line for each bit of test data is/are arranged at every second predetermined number of columns of the memory cell array, a spare memory cell array which is arranged in the memory core to relieve the memory cell array from a defective memory cell placed at an arbitrary column of the memory cell array and in which the number of columns is equal to the number of columns corresponding to each bit of test data in the checking circuit, and a change-over circuit for changing a block of columns of the memory cell array, which includes a defective memory cell and of which the column number is equal to the number of columns corresponding to each bit of data in the data input/output circuit, to a block of columns of the spare memory cell array.

Accordingly, the test operation can be performed without distinguishing the spare memory cell array from the memory cell array, and the memory cell array can be relieved from the defective memory cell by using the spare memory cell array. Also, the test operation can be performed before the relief of the memory cell array from the defective memory cell.

The fifth subordinate object is achieved by the provision of a semiconductor data storing circuit device, comprising a memory cell array which is arranged in a memory core of a semiconductor chip and has a plurality of memory cells arranged in a row or a plurality of rows and a plurality of columns, a data input/output circuit which is arranged in the memory core to be used in a normal operation of the memory cell array and in which a data input line or/and a data output line for each bit of data is/are arranged at every first predetermined number of columns of the memory cell array, a checking circuit which is arranged in the memory core to be used in a test operation performed in manufacturing of the memory cell array and in which a test data input line or/and a test data output line for each bit of test data is/are arranged at every second predetermined number of columns of the memory cell array, a spare memory cell array which is arranged in the memory core to relieve the memory cell array from a defective memory cell placed at an arbitrary column of the memory cell array and in which the number of columns is equal to the number of columns corresponding to each bit of test data in the checking circuit, a plurality of first change-over circuits, which are directly connected with the memory cell array, for respectively changing over from one column of the memory cell array to another column of the memory cell array in the normal operation, and a second change-over circuit for changing a block of columns of the memory cell array, which includes a defective memory cell and of which the column number is equal to the number of columns processed in each first change-over circuit, to a block of columns of the spare memory cell array.

Accordingly, the test operation can be performed without distinguishing the spare memory cell array from the memory cell array, and the memory cell array can be relieved from the defective memory cell by using the spare memory cell array. Also, the test operation can be performed before the relief of the memory cell array from the defective memory cell. In addition, because the number of blocks of columns of the spare memory cell array is high as compared with that in the changing of each block of columns of the memory cell array of which the column number is equal to the number of columns corresponding to one bit of data in the data input/output circuit, the memory cell array can be efficiently relieved from the defective memory cell.

The fifth subordinate object is achieved by the provision of a semiconductor data storing circuit device, comprising a memory cell array which is arranged in a memory core of a semiconductor chip and has a plurality of memory cells arranged in a row or a plurality of rows and a plurality of columns, a data input/output circuit which is arranged in the memory core to be used in a normal operation of the memory cell array and in which a data input line or/and a data output line for each bit of data is/are arranged at every first predetermined number of columns of the memory cell array, a checking circuit which is arranged in the memory core to be used in a test operation performed in manufacturing of the memory cell array and in which a test data input line or/and a test data output line for each bit of test data is/are arranged at every second predetermined number of columns of the memory cell array on condition that the second predetermined number of columns is lower than the first predetermined number of columns, a spare memory cell array which is arranged in the memory core to relieve the memory cell array from a defective memory cell placed at an arbitrary column of the memory cell array and in which the number of columns is equal to N times (N is a positive integral number) of the number of columns corresponding to each bit of test data in the checking circuit, and a change-over circuit for changing a block of columns of the memory cell array, which includes a defective memory cell and of which the column number is equal to the number of columns corresponding to each bit of data in the checking circuit, to a block of columns of the spare memory cell array.

Accordingly, the test operation can be performed without distinguishing the spare memory cell array from the memory cell array, and the memory cell array can be relieved from the defective memory cell by using the spare memory cell array. Also, the test operation can be performed before the relief of the memory cell array from the defective memory cell.

The sixth subordinate object is achieved by the provision of a semiconductor data storing circuit device, which has a plurality of memory cores on a semiconductor chip, comprising a memory cell array which is arranged in each memory core and has a plurality of memory cells arranged in a row or a plurality of rows and a plurality of columns on condition that a combination of the number of rows and the number of columns in the memory cell array of each memory core differs from those in the memory cell arrays of the other memory cores, a data input/output circuit which is arranged in each memory core to be used in a normal operation of the memory cell array of the memory core and in which a data input line or/and a data output line for each bit of data is/are arranged at every arbitrary number of columns of the memory cell array, a checking circuit which is arranged in each memory core to be used in a test operation performed in manufacturing of the memory cell array of the memory core and in which a test data input line or/and a test data output line for each bit of test data is/are arranged at every predetermined number of columns of the memory cell array on condition that the predetermined number of columns is common to the memory cores regardless of the arbitrary number of columns corresponding to the data input line or/and the data output line for each bit of data in the data input/output circuit of the memory core, and a spare memory cell array which is arranged in each memory core to relieve the memory cell array of the memory core from a defective memory cell placed at an arbitrary column of the memory cell array and in which the number of columns is equal to N times (N is a positive integral number) of the number of columns corresponding to each bit of test data in the checking circuit.

Accordingly, even though a plurality of memory cell arrays having combinations of the numbers of columns, the numbers of rows, the numbers of bits and the numbers of words different from each other are arranged in the same semiconductor chip, the processing from the test operation for the memory cell arrays to the relief of each memory cell array from a defective memory cell existing in the memory cell array can be performed according to one checking program having one algorithm.

The main object or the first subordinate object is achieved by the provision of a method of checking a semiconductor data storing circuit device, comprising the steps of preparing a memory cell array which is arranged in a memory core of a semiconductor chip and has a plurality of memory cells arranged in a row or a plurality of rows and a plurality of columns, preparing a data input/output circuit which is arranged in the memory core and in which a data input line or/and a data output line for each bit of data is/are arranged at every first predetermined number of columns of the memory cell array, preparing a checking circuit which is arranged in the memory core and in which a test data input line or/and a test data output line for each bit of test data is/are arranged at every second predetermined number of columns of the memory cell array on condition that the second predetermined number of columns differs from the first predetermined number of columns, and performing a test operation for the memory cell array through the test data input lines or/and the test data output lines of the checking circuit to perform a normal operation for the memory cell array through the data input lines or/and the data output lines of the data input/output circuit.

Accordingly, the number of test data input/output lines can be reduced in cases where the second predetermined number of columns is higher than the first predetermined number of columns, and a time required for the test operation in the manufacturing of the memory cell array can be shortened in cases where the second predetermined number of columns is lower than the first predetermined number of columns.

It is preferred that the second predetermined number of columns corresponding to the test data input line or/and the test data output line of the checking circuit is higher than the first predetermined number of columns corresponding to the data input line or/and the data output line of the data input/output circuit.

Accordingly, the number of test data input/output lines can be reduced.

It is preferred that the second predetermined number of columns corresponding to the test data input line or/and the test data output line of the checking circuit is lower than the first predetermined number of columns corresponding to the data input line or/and the data output line of the data input/output circuit.

Accordingly, because the number of memory cells simultaneously checked is increased, a time required for the test operation in the manufacturing of the memory cell array can be shortened.

The second, third or fourth subordinate object is achieved by the provision of a method of checking a semiconductor data storing circuit device, comprising the steps of preparing a memory cell array which is arranged in each of a plurality of memory cores of a semiconductor chip and has a plurality of memory cells arranged in a row or a plurality of rows and a plurality of columns, preparing a data input/output circuit which is arranged in each memory core and in which a data input line or/and a data output line for each bit of data is/are arranged at every arbitrary number of columns of the memory cell array of the memory cell, preparing a checking circuit which is arranged in each memory core and in which a test data input line or/and a test data output line for each bit of test data is/are arranged at every predetermined number of columns of the memory cell array on condition that the predetermined number of columns is common to the memory cores regardless of the arbitrary number of columns corresponding to the data input line or/and the data output line for each bit of data in the data input/output circuit of the memory core, and performing a test operation for the memory cell array of each memory core through the test data input lines or/and the test data output lines of the checking circuit of the memory core to perform a normal operation for the memory cell array of the memory core through the data input lines or/and the data output lines of the data input/output circuit of the memory core.

Accordingly, the test operation can be performed by using one checking program.

It is preferred that the number of rows and the number of columns in the memory cell array of each memory core are the same as those in the memory cell arrays of the other memory cores, and the arbitrary number of columns corresponding to the data input line or/and the data output line for each bit of data in the data input/output circuit of each memory core differs from the arbitrary number of columns in the data input/output circuits of the other memory cores.

Accordingly, even though a bit-word configuration of the memory cell array in one memory core differs from those in the other memory cores in cases where combinations of the numbers of rows and the numbers of columns in the memory cell arrays of the memory cores are the same as each other, the test operation for the memory cell arrays can be performed by using one checking program.

It is preferred that a combination of the number of rows and the number of columns in the memory cell array of each memory core differs from combinations of the numbers of rows and the numbers of columns in the memory cell arrays of the other memory cores.

Accordingly, the test operation for the memory cores can be performed by using one checking program by adding a virtual memory cell array to each memory cell array to make all memory cell arrays have the same column number and the same row number.

The second, third or fourth subordinate object is achieved by the provision of a method of checking a semiconductor data storing circuit device, comprising the steps of:

classifying a plurality of memory cores of a semiconductor chip into a plurality of types of memory cores;

preparing a memory cell array which is arranged in each memory core and has a plurality of memory cells arranged in a row or a plurality of rows and a plurality of columns on condition that a combination of the number of rows and the number of columns in the memory cell array of each memory core of one type differs from combinations of the numbers of rows and the numbers of columns in the memory cell arrays of the other memory cores of the type for each type of memory cores;

preparing a data input/output circuit which is arranged in each memory core of one type and in which a data input line or/and a data output line for each bit of data is/are arranged at every arbitrary number of columns of the memory cell array of the memory cell for each type of memory cores;

preparing a checking circuit which is arranged in each memory core of one type and in which a test data input line or/and a test data output line for each bit of test data is/are arranged at every predetermined number of columns of the memory cell array for each type of memory cores on condition that the predetermined number of columns is common to the memory cores regardless of the arbitrary number of columns corresponding to the data input line or/and the data output line for each bit of data in the data input/output circuit of the memory core on condition that the predetermined number of columns is common to one type of the memory cores regardless of the arbitrary number of columns in the corresponding data input/output circuit for each type of memory cores; and performing a test operation for the memory cell array of each memory core through the test data input lines or/and the test data output lines of the checking circuit of the memory core to perform a normal operation for the memory cell array of the memory core through the data input lines or/and the data output lines of the data input/output circuit of the memory core.

Accordingly, in cases where a virtual memory cell array is added to each memory cell array to make all memory cell arrays have the maximum column number and the maximum row number for each type of memory cores, the test operation for the memory cores can be performed by using one checking program for each type of memory cores.

The fifth subordinate object is achieved by the provision of a method of relieving the semiconductor data storing circuit device from a defective memory cell, comprising the steps of preparing a memory cell array which is arranged in a memory core of a semiconductor chip and has a plurality of memory cells arranged in a row or a plurality of rows and a plurality of columns, preparing a data input/output circuit which is arranged in the memory core and in which a data input line or/and a data output line for each bit of data is/are arranged at every first predetermined number of columns of the memory cell array, preparing a checking circuit which is arranged in the memory core and in which a test data input line or/and a test data output line for each bit of test data is/are arranged at every second predetermined number of columns of the memory cell array, preparing a spare memory cell array which is arranged in the memory core and in which the number of columns is equal to the number of columns corresponding to each bit of test data in the checking circuit, performing a test operation for the memory cell array of each memory core through the test data input lines or/and the test data output lines of the checking circuit of the memory core to detect a defective memory cell placed at an arbitrary column of one memory cell array, and changing a block of columns of the memory cell array, which includes a defective memory cell and of which the column number is equal to the number of columns corresponding to each bit of data in the data input/output circuit, to a block of columns of the spare memory cell array to relieve the memory cell array from the defective memory cell in cases where the defective memory cell placed at the block of columns of the memory cell array is detected according to the test operation.

Accordingly, the test operation can be performed without distinguishing the spare memory cell array from the memory cell array, and the memory cell array can be relieved from the defective memory cell by using the spare memory cell array. Also, the test operation can be performed before the relief of the memory cell array from the defective memory cell.

The fifth subordinate object is achieved by the provision of a method of relieving the semiconductor data storing circuit device from a defective memory cell, comprising the steps of preparing a memory cell array which is arranged in a memory core of a semiconductor chip and has a plurality of memory cells arranged in a row or a plurality of rows and a plurality of columns, preparing a data input/output circuit which is arranged in the memory core and in which a data input line or/and a data output line for each bit of data is/are arranged at every first predetermined number of columns of the memory cell array, preparing a checking circuit which is arranged in the memory core and in which a test data input line or/and a test data output line for each bit of test data is/are arranged at every second predetermined number of columns of the memory cell array, preparing a spare memory cell array which is arranged in the memory core and in which the number of columns is equal to the number of columns corresponding to each bit of test data in the checking circuit, preparing a plurality of first change-over circuits, which are directly connected with the memory cell array, for respectively changing over from one column of the memory cell array to another column of the memory cell array, performing a test operation for the memory cell array through the test data input lines or/and the test data output lines of the checking circuit to detect a defective memory cell placed at an arbitrary column of the memory cell array, and changing a block of columns of the memory cell array, which includes a defective memory cell and of which the column number is equal to the number of columns processed in each first change-over circuit, to a block of columns of the spare memory cell array to relieve the memory cell array from the defective memory cell in cases where the defective memory cell placed at the block of columns of the memory cell array is detected according to the test operation.

Accordingly, the test operation can be performed without distinguishing the spare memory cell array from the memory cell array, and the memory cell array can be relieved from the defective memory cell by using the spare memory cell array. Also, the test operation can be performed before the relief of the memory cell array from the defective memory cell. In addition, because the number of blocks of columns of the spare memory cell array is high as compared with that in the changing of each block of columns of the memory cell array of which the column number is equal to the number of columns corresponding to one bit of data in the data input/output circuit, the memory cell array can be efficiently relieved from the defective memory cell.

The fifth subordinate object is achieved by the provision of a method of relieving the semiconductor data storing circuit device from a defective memory cell, comprising the steps of preparing a memory cell array which is arranged in a memory core of a semiconductor chip and has a plurality of memory cells arranged in a row or a plurality of rows and a plurality of columns, preparing a data input/output circuit which is arranged in the memory core and in which a data input line or/and a data output line for each bit of data is/are arranged at every first predetermined number of columns of the memory cell array, preparing a checking circuit which is arranged in the memory core and in which a test data input line or/and a test data output line for each bit of test data is/are arranged at every second predetermined number of columns of the memory cell array on condition that the second predetermined number of columns is lower than the first predetermined number of columns, preparing a spare memory cell array which is arranged in the memory core and in which the number of columns is equal to N times (N is a positive integral number) of the number of columns corresponding to each bit of test data in the checking circuit, performing a test operation for the memory cell array through the test data input lines or/and the test data output lines of the checking circuit to detect a defective memory cell placed at an arbitrary column of the memory cell array, and changing a block of columns of the memory cell array, which includes a defective memory cell and of which the column number is equal to the number of columns corresponding to each bit of data in the checking circuit, to a block of columns of the spare memory cell array to relieve the memory cell array from the defective memory cell in cases where the defective memory cell placed at the block of columns of the memory cell array is detected according to the test operation.

Accordingly, the test operation can be performed without distinguishing the spare memory cell array from the memory cell array, and the memory cell array can be relieved from the defective memory cell by using the spare memory cell array. Also, the test operation can be performed before the relief of the memory cell array from the defective memory cell.

The sixth subordinate object is achieved by the provision of a method of relieving the semiconductor data storing circuit device from a defective memory cell, comprising the steps of preparing a memory cell array which is arranged in each of a plurality of memory cores of a semiconductor chip and has a plurality of memory cells arranged in a row or a plurality of rows and a plurality of columns on condition that a combination of the number of rows and the number of columns in the memory cell array of each memory core differs from combinations of the numbers of rows and the numbers of columns in the memory cell arrays of the other memory cores, preparing a data input/output circuit which is arranged in each memory core and in which a data input line or/and a data output line for each bit of data is/are arranged at every arbitrary number of columns of the memory cell array of the memory cell, preparing a checking circuit which is arranged in each memory core and in which a test data input line or/and a test data output line for each bit of test data is/are arranged at every predetermined number of columns of the memory cell array on condition that the predetermined number of columns is common to the memory cores regardless of the arbitrary number of columns corresponding to the data input line or/and the data output line for each bit of data in the data input/output circuit of the memory core, preparing a spare memory cell array which is arranged in each memory core and in which the number of columns is equal to N times (N is a positive integral number) of the number of columns corresponding to each bit of test data in the checking circuit, and relieving the memory cell array of a specific memory core from a defective memory cell by using the spare memory cell array in cases where the defective memory cell exists in the memory cell array of the specific memory core.

Accordingly, even though a plurality of memory cell arrays having combinations of the numbers of columns, the numbers of rows, the numbers of bits and the numbers of words different from each other are arranged in the same semiconductor chip, the processing from the test operation for the memory cell arrays to the relief of each memory cell array from a defective memory cell existing in the memory cell array can be performed according to one checking program having one algorithm.

BRIEF DESCRIPTION OF THE DRAWINGS

FIG. 6A is a conceptual view of a generally used semiconductor data storing circuit device having a plurality of types of memory cores;

FIG. 6B is a conceptual view of a semiconductor data storing circuit device having a plurality of types of memory cores according to a modification of the fourth embodiment of the present invention

FIG. 14 is a view conceptually showing a semiconductor data storing circuit device in which a block of spare memory cell array is additionally arranged on both sides of each memory cell array shown in FIG. 13;

FIG. 22A indicates a position of a defective cell in a memory cell array having a word-bit configuration of 16 words×4 bits;

FIG. 22B indicates a position of a defective cell in a memory cell array having a word-bit configuration of 32 words×2 bits; and FIG. 22C indicates a position of a defective cell in a memory cell array having a word-bit configuration of 64 words×1 bit.

DETAILED DESCRIPTION OF THE PREFERRED EMBODIMENTS

Embodiments of the present invention will now be described with reference to the accompanying drawings.
Embodiment 1

Figure 1:
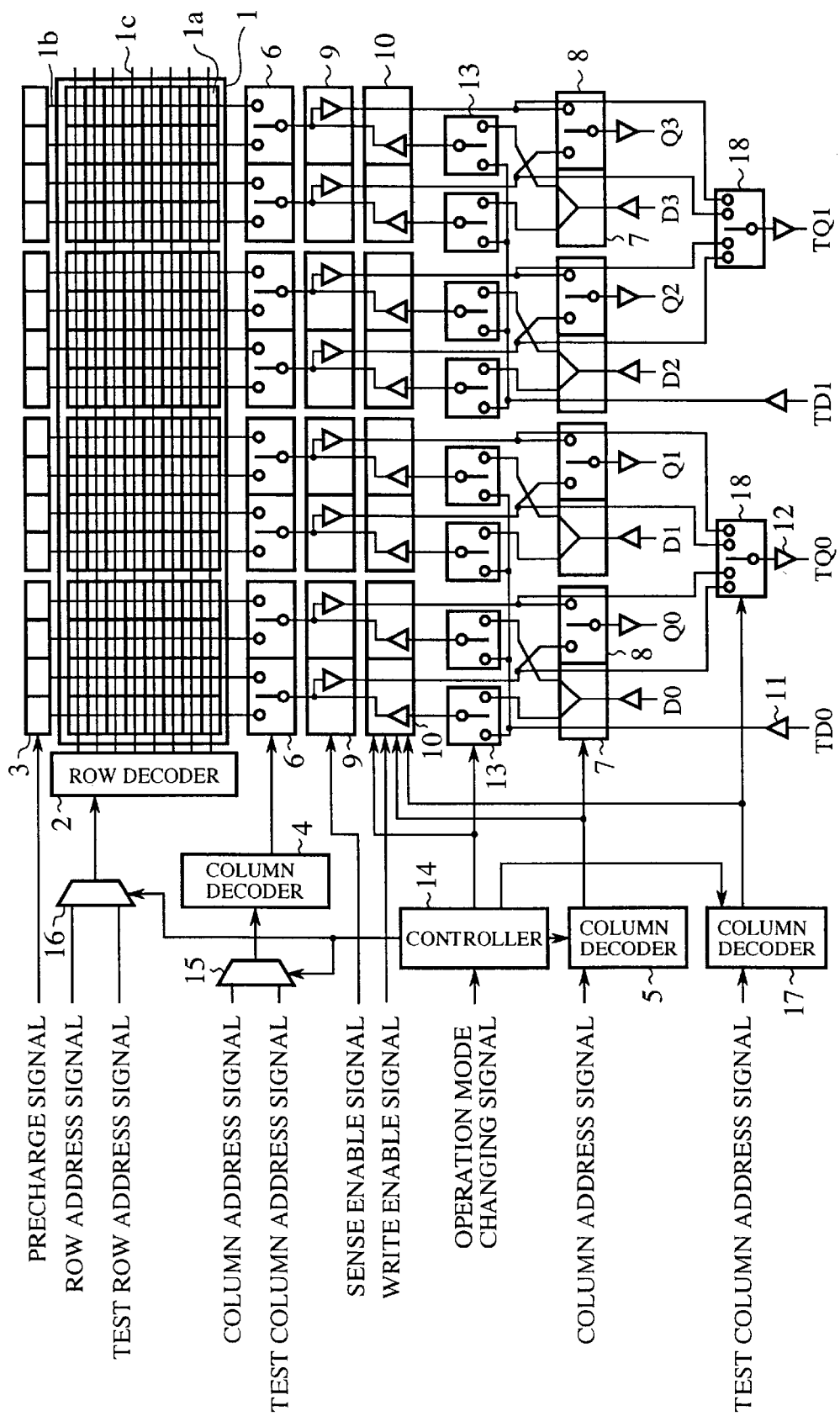
FIG. 1 is a block diagram showing the configuration of a memory core of a semiconductor data storing circuit device according to a first embodiment of the present invention.

FIG. 1 is a block diagram showing the configuration of a memory core of a semiconductor data storing circuit device according to a first embodiment of the present invention. In FIG. 1, 1 indicates a memory cell array having 8×16 memory cells in 8 rows and 16 columns. 1a indicates each of 128 (8×16) memory cells (hereinafter, called cells). 1b indicates each of 16 bit lines. 1c indicates each of 8 word lines. 2 indicates a row decoder. 3 indicates each of a plurality of precharge circuits. 4 indicates a column decoder. 5 indicates another column decoder. 6 indicates each of eight multiplexers of one-input (or one-output) and two-output (or two-input). The multiplexer 6 is arranged at every two columns. 7 indicates each of four demultiplexers of one-input and two-output. The demultiplexer 7 is arranged at every four columns. 8 indicates each of four multiplexers of two-input and one-output. The multiplexer 8 is arranged at every four columns. 9 indicates eight sense amplifiers respectively arranged at every two columns. 10 indicates eight write drivers respectively arranged at every two columns. 11 indicates each of six input buffers. 12 indicates each of six output buffers. 13 indicates each of eight multiplexers of two-input and one-output. The multiplexer 13 is arranged at every two columns. 14 indicates a controller. 15 indicates a column address selector. 16 indicates a row address selector. 17 indicates a column decoder. 18 indicates each of two multiplexers of four-input and one-output. The multiplexer 18 is arranged at every eight columns. D0, D1, D2 and D3 indicate four data input pins (or data input lines). Each data input pin is arranged at every four columns. Q0, Q1, Q2 and Q3 indicate four data output pins(or data output lines). Each data output pin is arranged at every four columns. TD0 and TD1 indicate two test data input pins (or test data input lines). TQ0 and TQ1 indicate two test data output pins (or test data output lines).

A data input/output circuit is composed of constituent elements relating to data input/output of a normal operation performed in the memory cell array 1 shown in FIG. 1, and a checking circuit is composed of constituent elements relating to test data input/output of a test operation performed in the memory cell array 1 shown in FIG. 1. That is, the data input/output circuit is composed of constituent elements relating to the input procedure, in which data input to the data input pins D0, D1, D2 and D3 is transmitted to the memory cell array 1, and the output procedure in which data stored in the memory cell array 1 is transmitted to the data output pins Q0, Q1, Q2 and Q3. Also, the checking circuit is composed of constituent elements relating to the input procedure, in which test data input to the test data input pins TD0 and TD1 is transmitted to the memory cell array 1, and the output procedure in which data stored in the memory cell array 1 is transmitted to the test data output pins TQ0 and TQ1. The definition of the configuration of the data input/output circuit and the checking circuit in following embodiments is the same as that in the first embodiment. The description whether each constituent element shown in FIG. 1 is included in the data input/output circuit, the checking circuit or the both circuits is omitted because a following operation description apparently indicates whether each constituent element shown in FIG. 1 is included in the data input/output circuit, the checking circuit or the both circuits.

Next, an operation of the memory core of the semiconductor data storing circuit device will be described below.

In cases where an operation mode changing signal input to the controller 14 indicates a normal operation mode, the eight multiplexers 13 are connected with the data input pins D0, D1, D2 and D3 through the corresponding input buffers 11 and the demultiplexers 7, the column address selector 15 selects a column address signal, and the row address selector 16 selects a row address signal.

Thereafter, the row address signal is input to the row decoder 2, and one specific row is specified according to the row address signal. Also, the column address signal is input to the column decoders 4 and 5, and four specific columns are specified according to the column address signal. In a write mode operation, four bits of data input to the data input pins D0, D1, D2 and D3 are simultaneously written in four specific cells of the memory cell array 1 arranged at the specific row and the specific columns through the corresponding input buffers 11, the demultiplexers 7, the corresponding multiplexers 13, the corresponding write drivers 10 and the corresponding multiplexers 6. The writing of the bits of data is repeatedly performed. In contrast, in a read mode operation, four bits of data stored in four specific cells of the memory cell array 1 arranged at the specific row and the specific columns are simultaneously read out to the data output pins Q0, Q1, Q2 and Q3 through the corresponding multiplexer 6, the corresponding sense amplifier 9, the multiplexer 8 and the corresponding output buffer 12, and the bits of data are output from the data output pin Q0, Q1, Q2 or Q3. The reading-out of the bits of data is repeatedly performed.

Also, in cases where the operation mode changing signal input to the controller 14 indicates a test operation mode, the four multiplexers 13 corresponding to the first to eight columns are connected with the test data input pin TD0, the other four multiplexers 13 corresponding to the ninth to sixteenth columns are connected with the test data input pin TD1, a test column address signal is selected in the column address selector 15, and a test row address signal is selected in the row address selector 16.

Thereafter, the test row address signal is input to the row decoder 2, and one specific row is specified according to the test row address signal. Also, the test column address signal is input to the column decoders 4 and 17, and two specific columns are specified according to the test column address signal. In a write mode operation, two bits of test data input to the test data input pins TD0 and TD1 are simultaneously written in two specific cells of the memory cell array 1 arranged at the specific row and the specific columns through the corresponding input buffers 11, the corresponding multiplexers 13, the corresponding write drivers 10 and the corresponding multiplexers 6. The writing of the two bits of test data is repeatedly performed. In contrast, in a read mode operation, two bits of data of two specific cells of the memory cell array 1 arranged at the specific row and the specific columns are read out as two bits of test data to the test data output pins TQ0 and TQ1 through the corresponding multiplexers 6, the corresponding sense amplifiers 9, the corresponding multiplexers 18 and the corresponding output buffers 12, and the bits of test data are output from the test data output pins TQ0 and TQ1. The reading-out of the two bits of test data is repeatedly performed.

Therefore, in the first embodiment, each group of four columns of the memory cell array 1 corresponds to one bit of data passing through the data input/output circuit used in the normal operation, and each group of eight columns of the memory cell array 1 corresponds to one bit of test data passing through the checking circuit used in the test operation.

As is described above, in the first embodiment, the semiconductor data storing circuit device comprises the memory cell array 1 having a plurality of memory cells arranged in a plurality of rows and a plurality of columns, the data input/output circuit which is arranged in the memory core to be used in the normal operation of the memory cell array 1 and in which a data input line and a data output line for one bit of data are arranged at every four columns of the memory cell array 1, and the checking circuit which is arranged in the memory core to be used in the test operation performed in the manufacturing of the memory cell array 1 and in which a test data input line and a test data output line for one bit of test data are arranged at every eight columns of the memory cell array 1. Because the number of test data input/output lines of the checking circuit is half of the number of data input/output lines of the data input/output circuit, the number of input/output lines for the test operation can be reduced, and the semiconductor data storing circuit device can be easily manufactured.

Embodiment 2

Figure 2:
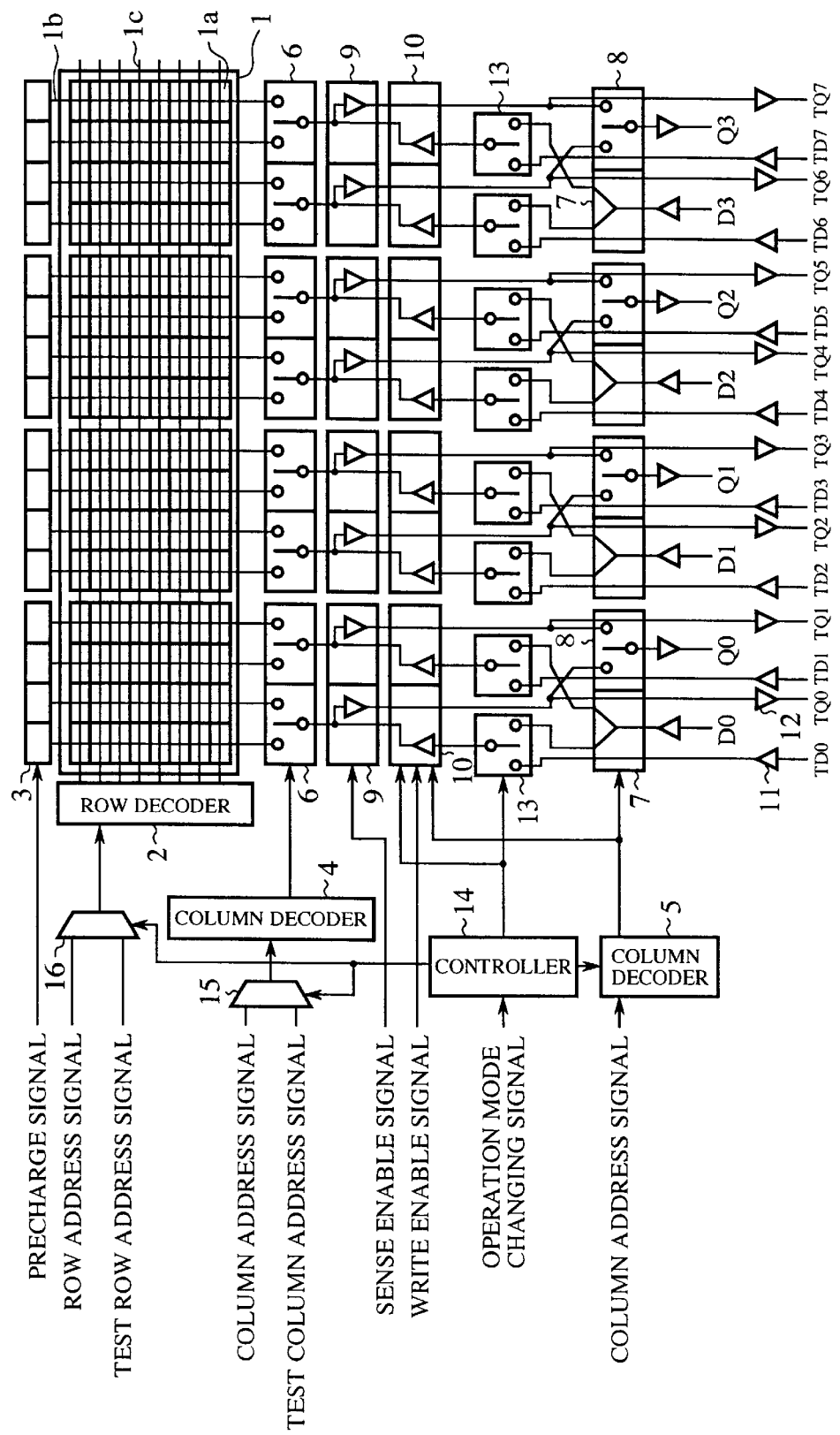
FIG. 2 is a block diagram showing the configuration of a memory core of a semiconductor data storing circuit device according to a second embodiment and a third embodiment of the present invention.

FIG. 2 is a block diagram showing the configuration of a memory core of a semiconductor data storing circuit device according to a second embodiment of the present invention. In FIG. 2, the memory array 1 and the data input/output circuit are the same as those shown in FIG. 1. However, either the column decoder 17 or the group of multiplexers 18 used for the test operation in the first embodiment is not used in the second embodiment, and each group of two columns of the memory cell array 1 corresponds to one bit of data passing through the checking circuit used in the test operation. That is, the test data input pins TD0 to TD7 are connected with the multiplexers 13 through a plurality of input buffers 11 respectively, and the test data output pins TQ0 to TQ7 are connected with the sense amplifiers 9 through a plurality of output buffers 12 respectively.

Next, an operation of the memory core of the semiconductor data storing circuit device will be described below.

In cases where an operation mode changing signal input to the controller 14 indicates a normal operation mode, the eight multiplexers 13 are connected with the data input pins D0, D1, D2 and D3 through the corresponding input buffers 11 and the demultiplexers 7, the column address selector 15 selects a column address signal, and the row address selector 16 selects a row address signal. Therefore, a normal operation is performed in the same manner as in the first embodiment. That is, in a write mode operation, four bits of data input to the data input pins D0, D1, D2 and D3 are simultaneously written in four specific cells of the memory cell array 1 through the corresponding input buffers 11, the corresponding demultiplexers 7, the corresponding multiplexers 13, the corresponding write drivers 10 and the corresponding multiplexers 6. The writing of the bits of data is repeatedly performed. In contrast, in a read mode operation, four bits of data stored in four specific cells of the memory cell array 1 are read out to the data output pins Q0, Q1, Q2 and Q3 through the corresponding multiplexers 6, the corresponding sense amplifiers 9, the corresponding multiplexers 8 and the corresponding output buffers 12 and are output from the data output pins Q0, Q1, Q2 and Q3. The reading-out of the bits of data is repeatedly performed.

Also, in cases where the operation mode changing signal input to the controller 14 indicates a test operation mode, the eight multiplexers 13 are connected with the test data input pins TD0 to TD7 through the input buffers 11, a test column address signal is selected in the column address selector 15, and a test row address signal is selected in the row address selector 16.

Thereafter, the test row address signal is input to the row decoder 2, and one specific row is specified according to the test row address signal. Also, the test column address signal is input to the column decoder 4, and eight specific columns are specified according to the test column address signal. In a write mode operation, eight bits of test data input to the test data input pins TD0 to TD7 are simultaneously written in eight specific cells of the memory cell array 1 corresponding to the specific row and the specific columns through the input buffers 11, the multiplexers 13, the write drivers 10 and the multiplexers 6. The writing of the bits of test data is repeatedly performed. In contrast, in a read mode operation, eight bits of data of eight specific cells of the memory cell array 1 corresponding to the specific row and the specific columns are simultaneously read out as eight bits of test data to the test data output pins TQ0 to TQ7 through the multiplexers 6, the sense amplifiers 9 and the output buffers 12, and the eight bits of test data are output from the test data output pins TQ0 to TQ7. The reading-out of the bits of test data is repeatedly performed.

Therefore, in the second embodiment, each group of four columns of the memory cell array 1 corresponds to one bit of data passing through the data input/output circuit used in the normal operation, and each group of two columns of the memory cell array 1 corresponds to one bit of test data passing through the checking circuit used in the test operation.

As is described above, in the second embodiment, the semiconductor data storing circuit device comprises the memory cell array 1 which is arranged in a memory core of a semiconductor chip and has a plurality of memory cells arranged in a plurality of rows and a plurality of columns, the data input/output circuit which is arranged in the memory core to be used in the normal operation of the memory cell array 1 and in which a data input line and a data output line for one bit of data are arranged at every four columns of the memory cell array 1, and the checking circuit which is arranged in the memory core to be used in the test operation performed in the manufacturing of the memory cell array 1 and in which a test data input line and a test data output line for one bit of test data are arranged at every two columns of the memory cell array 1. Because eight memory cells of the memory cell array 1 can be simultaneously checked by using eight bits of test data, a test operation time in the manufacturing of the memory cell array 1 can be shortened.

Embodiment 3

Figure 3:
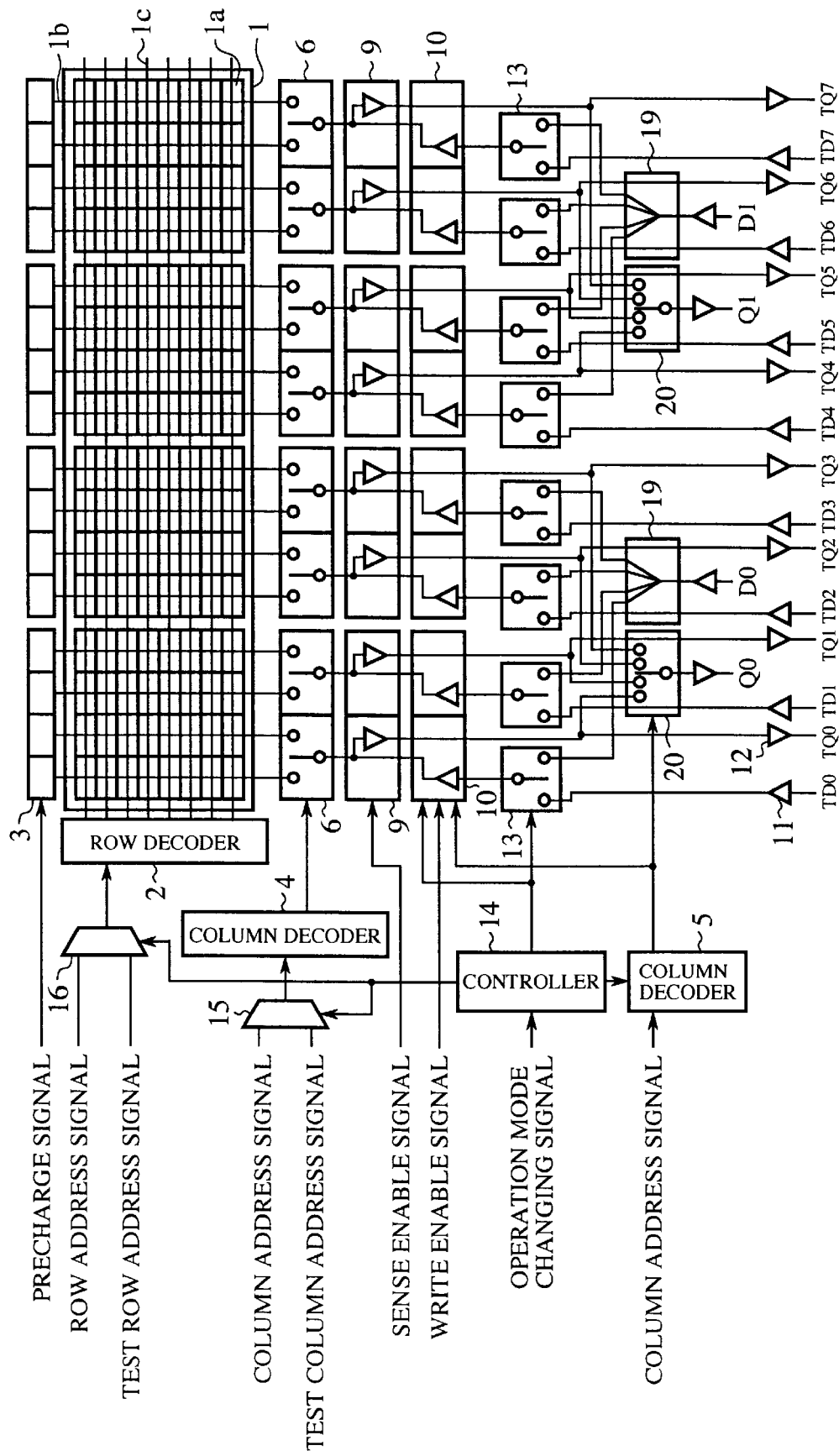
FIG. 3 is a block diagram showing the configuration of a memory core of a semiconductor data storing circuit device according to a third embodiment of the present invention.
Figure 4:
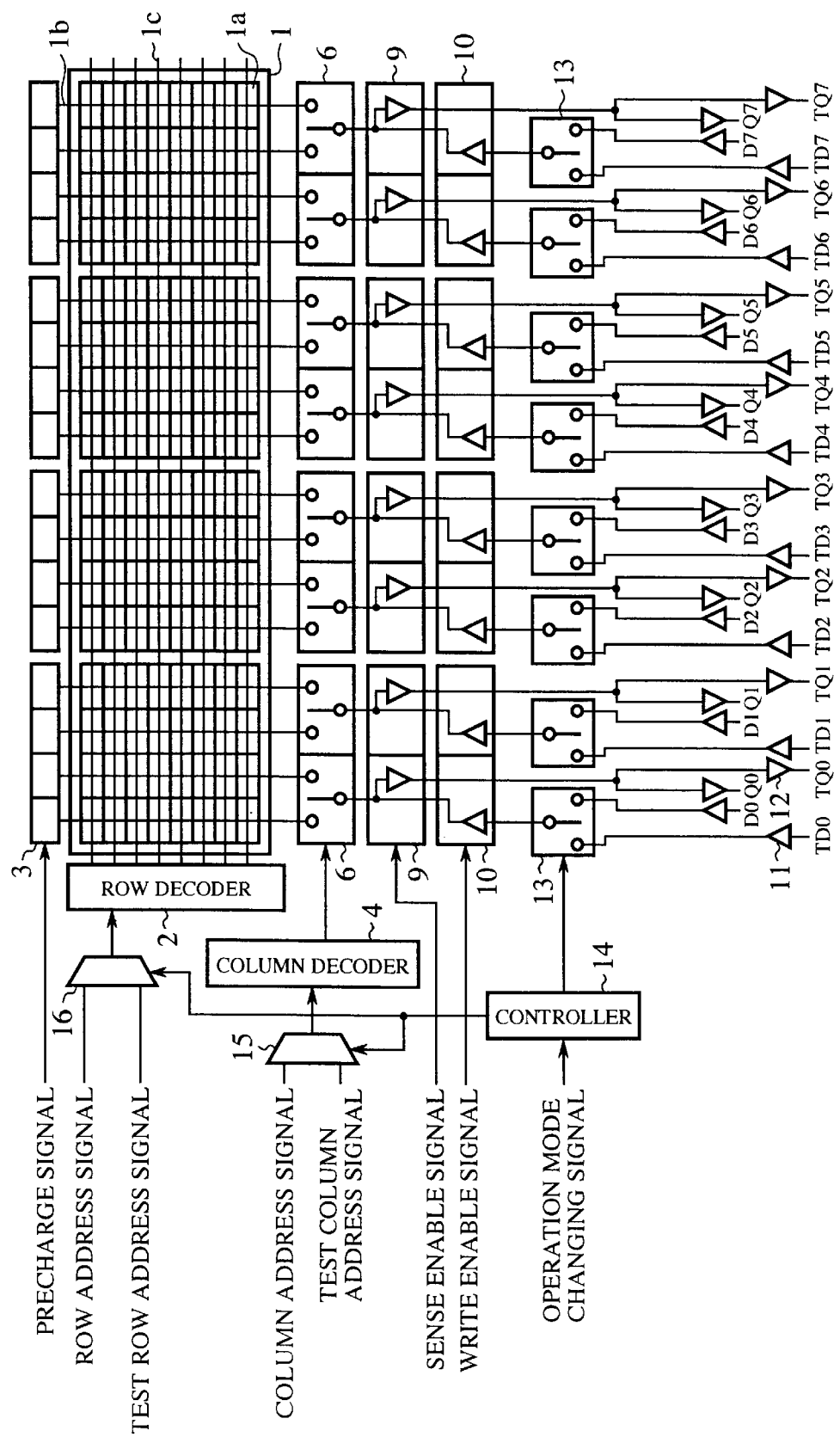
FIG. 4 is a block diagram showing the configuration of another memory core of the semiconductor data storing circuit device according to the third embodiment of the present invention.

FIG. 3 is a block diagram showing the configuration of a memory core of a semiconductor data storing circuit device according to a third embodiment of the present invention, and FIG. 4 is a block diagram showing the configuration of another memory core of the semiconductor data storing circuit device according to the third embodiment of the present invention.

In this embodiment, three semiconductor data storing circuit devices shown in FIG. 2, FIG. 3 and FIG. 4 are adopted. The checking circuits and the memory cell arrays 1 arranged in these semiconductor data storing circuit devices have the same configuration as each other, but the data input/output circuits arranged in these semiconductor data storing circuit devices have three configurations different from each other. Because the configuration and operation of the semiconductor data storing circuit device shown in FIG. 2 is described according to the second embodiment, the description of the configuration and operation of the semiconductor data storing circuit device shown in FIG. 2 is omitted in the third embodiment. The configuration and operation of the semiconductor data storing circuit device shown in FIG. 3 is initially described.

In FIG. 3, a connection relationship among the memory cell array 1, the test data input pins TD0 to TD7, the test data output pins TQ0 to TQ7, the multiplexers 6, the sense amplifiers 9, the write drivers 10 and the multiplexers 13 is the same as that shown in FIG. 2. 19 indicates each of two demultiplexers of one-input and four-output. The demultiplexer 19 is arranged at every eight columns of the memory cell array 1. 20 indicates each of two multiplexers of four-input and one-output. The multiplexer 20 is arranged at every eight columns of the memory cell array 1. D0 and D1 indicate two data input pins. Each data input pin is arranged at every eight columns. Q0 and Q1 indicate two data output pins. Each data output pin is arranged at every eight columns.

Next, an operation of the memory core shown in FIG. 3 will be described below.

In cases where an operation mode changing signal input to the controller 14 indicates a normal operation mode, the four multiplexers 13 are connected with the data input pin D0 through one demultiplexer 19, and the other four multiplexers 13 are connected with the data input pin D1 through the other demultiplexer 19. In a write mode operation, two bits of data input to the data input pin D0 and D1 are simultaneously written in two specific cells of the memory cell array 1 through the corresponding input buffers 11, the demultiplexers 19, the corresponding multiplexers 13, the corresponding write drivers 10 and the corresponding multiplexers 6. The writing of the bits of data is repeatedly performed. In contrast, in a read mode operation, two bits of data stored in two specific cells of the memory cell array 1 are read out to the data output pins Q0 and Q1 through the corresponding multiplexers 6, the corresponding sense amplifiers 9, the multiplexers 20 and the corresponding output buffers 12, and the two bits of data are output from the data output pins Q0 and Q1. The reading-out of the bits of data is repeatedly performed.

Also, in cases where the operation mode changing signal input to the controller 14 indicates a test operation mode, the test operation is performed in the same manner as in the second embodiment. That is, in a write mode operation, eight bits of test data input to the test data input pins TD0 to TD7 are simultaneously written in eight specific cells through the corresponding input buffers 11, the multiplexers 13, the write drivers 10 and the multiplexers 6. The writing of the bits of test data is repeatedly performed. In contrast, in a read mode operation, eight bits of data stored in eight specific cells are simultaneously read out as eight bits of test data to the test data output pins TQ0 to TQ7 through the multiplexers 6, the sense amplifiers 9 and the corresponding output buffers 12, and the eight bits of test data are output from the test data output pins TQ0 to TQ7. The reading-out of the bits of test data is repeatedly performed.

The configuration and operation of the semiconductor data storing circuit device shown in FIG. 4 will be described below.

In FIG. 4, a connection relationship among the memory cell array 1, the test data input pins TD0 to TD7, the test data output pins TQ0 to TQ7, the multiplexers 6, the sense amplifiers 9, the write drivers 10 and the multiplexers 13 is the same as that shown in FIG. 2. D0 to D7 indicate eight data input pins. Each data input pin is connected with the corresponding multiplexer 13. Q0 to Q7 indicate eight data output pins. Each data output pin is connected with the corresponding sense amplifier 9. Because each bit of data passing through the data input/output circuit corresponds to two columns of the memory cell array 1, a group of the column decoder 5 shown in FIG. 2 and FIG. 3, the demultiplexers 7 and the multiplexers 8 shown in FIG. 2 and the demultiplexers 19 and the multiplexers 20 shown in FIG. 3 is not required. The other constituent elements are the same as those shown in FIG. 2 or FIG. 3.

Next, an operation of the memory core shown in FIG. 4 will be described below.

In cases where an operation mode changing signal input to the controller 14 indicates a normal operation mode, the multiplexerss 13 are connected with the data input pins D0 to D7 through the input buffers 11. In a write mode operation, eight bits of data input to the data input pins D0 to D7 are simultaneously written in eight specific cells of the memory cell array 1 through the input buffers 11, the multiplexers 13, the write drivers 10 and the multiplexers 6. The writing of the bits of data is repeatedly performed. In contrast, in a read mode operation, eight bits of data stored in eight specific cells of the memory cell array 1 are read out to the data output pins Q0 to Q7 through the multiplexers 6, the sense amplifiers 9, the multiplexers 20 and the output buffers 12, and the eight bits of test data are output from the data output pins Q0 to Q7. The reading-out of the bits of data is repeatedly performed.

Also, in cases where the operation mode changing signal input to the controller 14 indicates a test operation mode, the test operation is performed in the same manner as in the second embodiment. That is, in a write mode operation, eight bits of test data input to the test data input pins TD0 to TD7 are simultaneously written in eight specific cells. In contrast, in a read mode operation, eight bits of data stored in eight specific cells are simultaneously read out to the test data output pins TQ0 to TQ7.

In summary, each bit of data passing through the data input/output circuit corresponds to four columns of the memory cell array 1 shown in FIG. 2, each bit of data passing through the data input/output circuit corresponds to eight columns of the memory cell array 1 shown in FIG. 3, and each bit of data passing through the data input/output circuit corresponds to two columns of the memory cell array 1 shown in FIG. 4. In other words, the word-bit configuration of the memory cell array 1 shown in FIG. 2 is set to 32 words×4 bits, the word-bit configuration of the memory cell array 1 shown in FIG. 3 is set to 64 words×2 bits, and the word-bit configuration of the memory cell array 1 shown in FIG. 4 is set to 16 words×8 bits. In contrast, each bit of data passing through the checking circuit in the test operation performed in the manufacturing of the memory cell array 1 corresponds to two columns of any of the memory cell arrays 1 shown in FIG. 2, FIG. 3 and FIG. 4 regardless of the difference of the word-bit configurations of the memory cell arrays 1 shown in FIG. 2, FIG. 3 and FIG. 4

As is described above, in the third embodiment, the semiconductor data storing circuit device comprises the memory cell array 1 which is arranged in a memory core of a semiconductor chip and has a plurality of memory cells arranged in a plurality of rows and a plurality of columns, the data input/output circuit which is arranged in the memory core to be used in the normal operation of the memory cell array 1 and in which a data input line and a data output line for one bit of data are arranged at every arbitrary number of columns (for example, every four columns, every eight columns or every two columns) of the memory cell array 1, and the checking circuit which is arranged in the memory core to be used in the test operation performed in the manufacturing of the memory cell array 1 and in which a test data input line and a test data output line for one bit of test data are arranged at every predetermined number of columns (for example, every two columns) of the memory cell array 1 regardless of the number of columns corresponding to the data input and output lines for each bit of data passing through the data input /output circuit. Accordingly, in cases where the memory cell arrays 1 of the memory cores have the same cell configuration (that is, the combination of the number of columns and the number of rows) as each other, even though the word-bit configurations of the memory cell arrays 1 are different from each other, the test operations in the manufacturing of the memory cell arrays 1 can be performed according to one checking program.

Embodiment 4

Figure 5B:
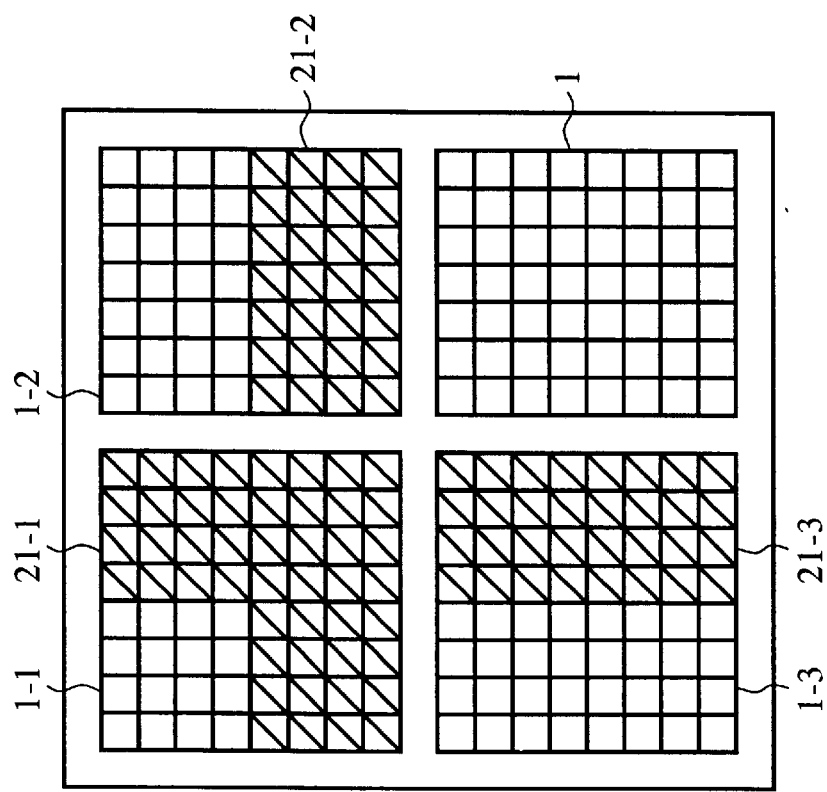
FIG. 5B is a conceptual view of a semiconductor data storing circuit device according to a fourth embodiment of the present invention.
Figure 5A:
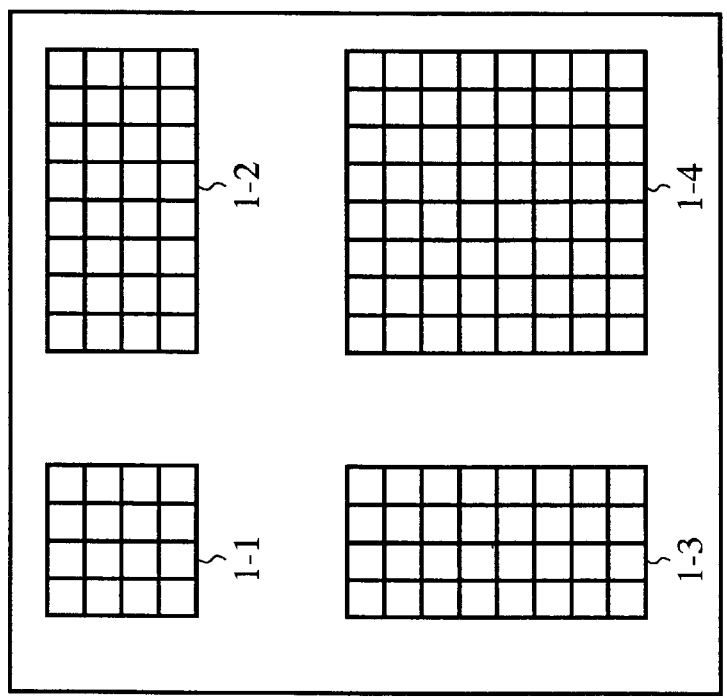
FIG. 5A is a conceptual view of a semiconductor data storing circuit device generally used.

FIG. 5A is a conceptual view of a semiconductor data storing circuit device generally used, and FIG. 5B is a conceptual view of a semiconductor data storing circuit device according to a fourth embodiment of the present invention.

In FIG. 5A, 1-1, 1-2, 1-3 and 1-4 indicate four memory cores arranged in a semiconductor data storing circuit device of a semiconductor chip generally used. The cell configurations (that is, the combinations of the numbers of columns and the numbers of rows) of memory cell arrays of the memory cores 1-1, 1-2, 1-3 and 1-4 differ from each other. That is, a memory cell array of the memory core 1-1 has 16 cells of 4 columns×4 rows, a memory cell array of the memory core 1-2 has 32 cells of 8 columns×4 rows, a memory cell array of the memory core 1-3 has 32 cells of 4 columns×8 rows, and a memory cell array of the memory core 1-4 has 64 cells of 8 columns×8 rows. Therefore, the maximum number of columns in the memory cell arrays is 8, and the maximum number of rows in the memory cell arrays is 8.

Figure 21:
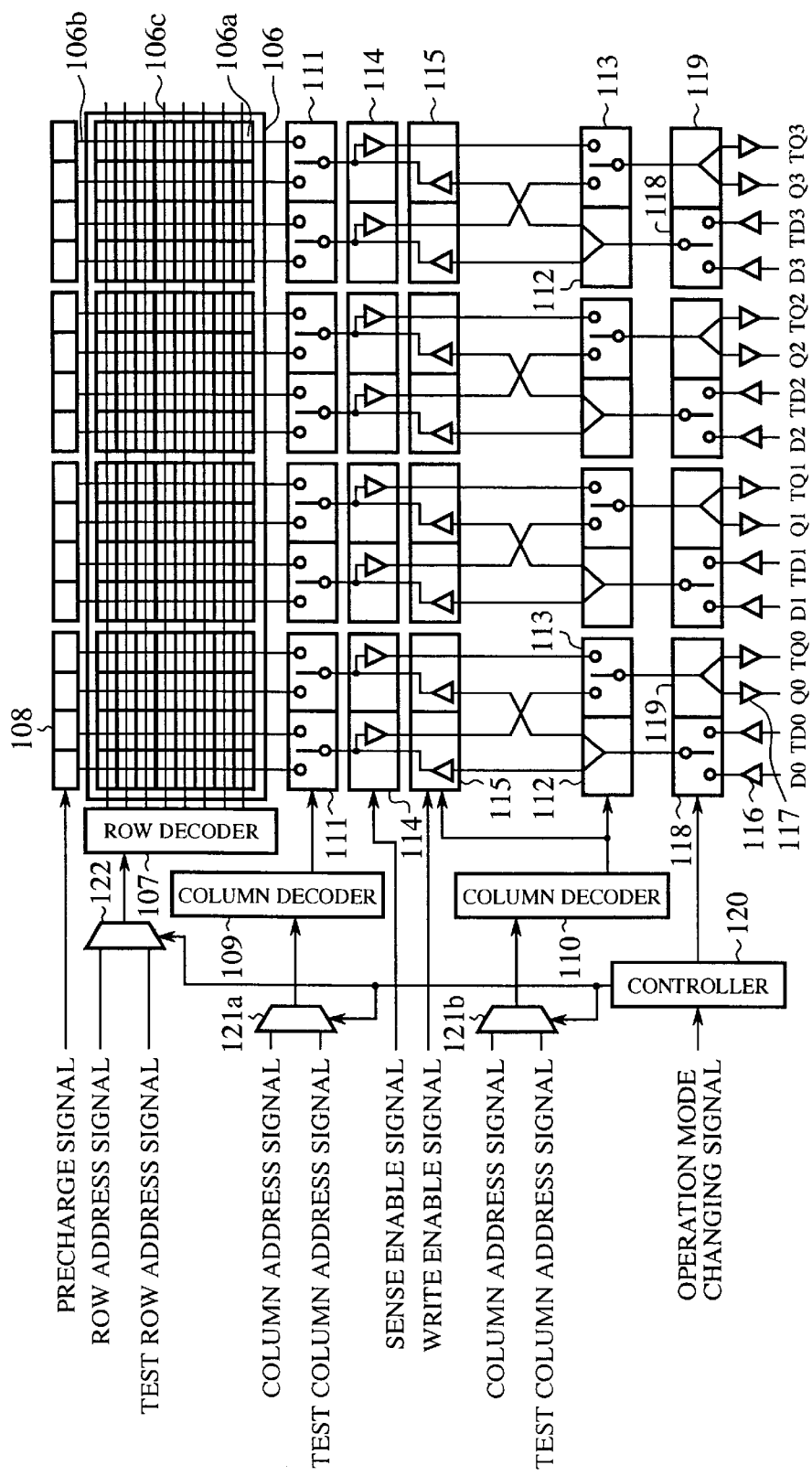
FIG. 21 is a block diagram showing the configuration of each memory core in which a checking circuit is arranged.

In FIG. 5B, 21-1 indicates a virtual memory cell array which is added to the memory core 1-1 to set an enlarged memory cell array of the memory core 1-1 to the cell configuration of the maximum number of columns and the maximum number of rows. 21-2 indicates a virtual memory cell array which is added to the memory core 1-2 to set an enlarged memory cell array of the memory core 1-2 to the cell configuration of the maximum number of columns and the maximum number of rows. 21-3 indicates a virtual memory cell array which is added to the memory core 1-3 to set an enlarged memory cell array of the memory core 1-3 to the cell configuration of the maximum number of columns and the maximum number of rows. Because the memory cell array of the memory core 1-4 has the cell configuration of the maximum number of columns and the maximum number of rows, no virtual memory cell array is added to the memory core 1-4. Therefore, the memory cell arrays of all memory cores are respectively set to the same cell configuration of the maximum number of columns and the maximum number of rows.

The test operation is performed for the enlarged memory cell arrays of the memory cores according to one checking program, and a checking result for the cells of the virtual memory cell arrays is disregarded.

As is described above, in the fourth embodiment, in cases where a plurality of memory cell arrays of a plurality of memory cores have a plurality of cell configurations different from each other, the number of columns and the number of rows in the cell configuration of each memory cell array are adjusted to set the memory cell arrays to the same cell configuration of the maximum number of columns and the maximum number of rows. For example, the number of columns corresponding to each bit of test data passing through the checking circuit is set to the same value in the memory cell arrays of all memory cores regardless of the number of columns corresponding to each bit of data passing through the data input/output circuit. Accordingly, because the memory cell arrays of the memory cores are virtually set to the same cell configuration, the test operation in the manufacturing of the memory cell array 1 can be performed for the memory cell arrays of the memory cores according to one checking program even though the cell configurations of the memory cell arrays actually differ from each other.

In this embodiment, in cases where no memory cell array actually exists in a memory core, it is inappropriate that an enlarged memory cell array including only a virtual memory cell array is formed in the memory core.

FIG. 6A is a conceptual view of a generally used semiconductor data storing circuit device having a plurality of types of memory cores, and FIG. 6B is a conceptual view of a semiconductor data storing circuit device having a plurality of types of memory cores according to a modification of the fourth embodiment of the present invention.

In FIG. 6A, 1-5, 1-6, 1-7 and 1-8 indicate four memory cores of a single port type A arranged in a chip of a semiconductor data storing circuit device generally used, and 1-9, 1-10 and 1-11 indicate three memory cores of a dual port type B arranged in the semiconductor data storing circuit device. The cell configurations of memory cell arrays of the memory cores 1-5, 1-6, 1-7 and 1-8 of the single port type A differ from each other. That is, a memory cell array of the memory core 1-5 has 32 cells of 8 columns×4 rows, a memory cell array of the memory core 1-6 has 32 cells of 4 columns×8 rows, a memory cell array of the memory core 1-7 has 16 cells of 4 columns×4 rows, and a memory cell array of the memory core 1-8 has 64 cells of 8 columns×8 rows. Therefore, the maximum number of columns in the memory cell arrays of the memory cores 1-5, 1-6, 1-7 and 1-8 of the single port type A is 8, and the maximum number of rows in the memory cell arrays of the memory cores 1-5, 1-6, 1-7 and 1-8 of the single port type A is 8.

Also, the cell configurations of memory cell arrays of the memory cores 1-9, 1-10 and 1-11 of the dual port type B differ from each other. That is, a memory cell array of the memory core 1-9 has 16 cells of 2 columns×8 rows, a memory cell array of the memory core 1-10 has 16 cells of 4 columns×4 rows, and a memory cell array of the memory core 1-11 has 8 cells of 2 columns×4 rows. Therefore, the maximum number of columns in the memory cell arrays of the memory cores 1-9, 1-10 and 1-11 of the dual port type B is 4, and the maximum number of rows in the memory cell arrays of the memory cores 1-9, 1-10 and 1-11 of the dual port type B is 8.

In FIG. 6B, 21-5 indicates a virtual memory cell array which is added to the memory core 1-5 to set an enlarged memory cell array of the memory core 1-5 to the cell configuration of the maximum number of columns and the maximum number of rows in the single port type A. 21-6 indicates a virtual memory cell array which is added to the memory core 1-6 to set an enlarged memory cell array of the memory core 1-6 to the cell configuration of the maximum number of columns and the maximum number of rows in the single port type A. 21-7 indicates a virtual memory cell array which is added to the memory core 1-7 to set an enlarged memory cell array of the memory core 1-7 to the cell configuration of the maximum number of columns and the maximum number of rows in the single port type A. Because the memory cell array of the memory core 1-8 has the cell configuration of the maximum number of columns and the maximum number of rows in the single port type A, no virtual memory cell array is added to the memory core 1-8. Therefore, the memory cell arrays of all memory cores 1-5, 1-6, 1-7 and 1-8 are set to the same cell configuration of the maximum number of columns and the maximum number of rows in the single port type A.

Also, 21-9 indicates a virtual memory cell array which is added to the memory core 1-9 to set an enlarged memory cell array of the memory core 1-9 to the cell configuration of the maximum number of columns and the maximum number of rows in the single port type B. 21-10 indicates a virtual memory cell array which is added to the memory core 1-10 to set an enlarged memory cell array of the memory core 1-10 to the cell configuration of the maximum number of columns and the maximum number of rows in the single port type B. 21-11 indicates a virtual memory cell array which is added to the memory core 1-11 to set an enlarged memory cell array of the memory core 1-11 to the cell configuration of the maximum number of columns and the maximum number of rows in the single port type B. Therefore, the memory cell arrays of all memory cores 1-9, 1-10 and 1-11 are set to the same cell configuration of the maximum number of columns and the maximum number of rows in the single port type B.

The test operation is performed for the enlarged memory cell arrays of the memory cores of the single port type according to one checking program, and a checking result for the cells of the virtual memory cell arrays is disregarded. Also, the test operation is performed for the enlarged memory cell arrays of the memory cores of the dual port type according to another checking program, and a checking result for the cells of the virtual memory cell arrays is disregarded.

As is described above, in the modification of the fourth embodiment, in cases where a plurality of types of memory cores are arranged in a chip of a semiconductor data storing circuit device and a plurality of memory cell arrays of a plurality of memory cores of each type are set to a plurality of cell configurations different from each other, the numbers of columns and the numbers of rows in the memory cell arrays are adjusted for each type of memory cores to set the memory cell arrays of the memory cores to the same cell configuration. For example, the number of columns corresponding to each bit of test data passing through the checking circuit is set to the same value in the memory cores for each type of memory cores regardless of the number of columns corresponding to each bit of data passing through the data input/output circuit. Accordingly, because the memory cell arrays of the memory cores are set to the same cell configuration for each type, the test operation can be performed for the memory cell arrays of the memory cores according to one checking program in the manufacturing of the memory cell arrays 1 for each type even though the cell configurations of the memory cell arrays of each type of memory cores differ from each other.

In this modification, in cases where no memory cell array actually exists in a memory core, it is inappropriate that an enlarged memory cell array including only a virtual memory cell array is formed in the memory core.

Embodiment 5

Figure 7:
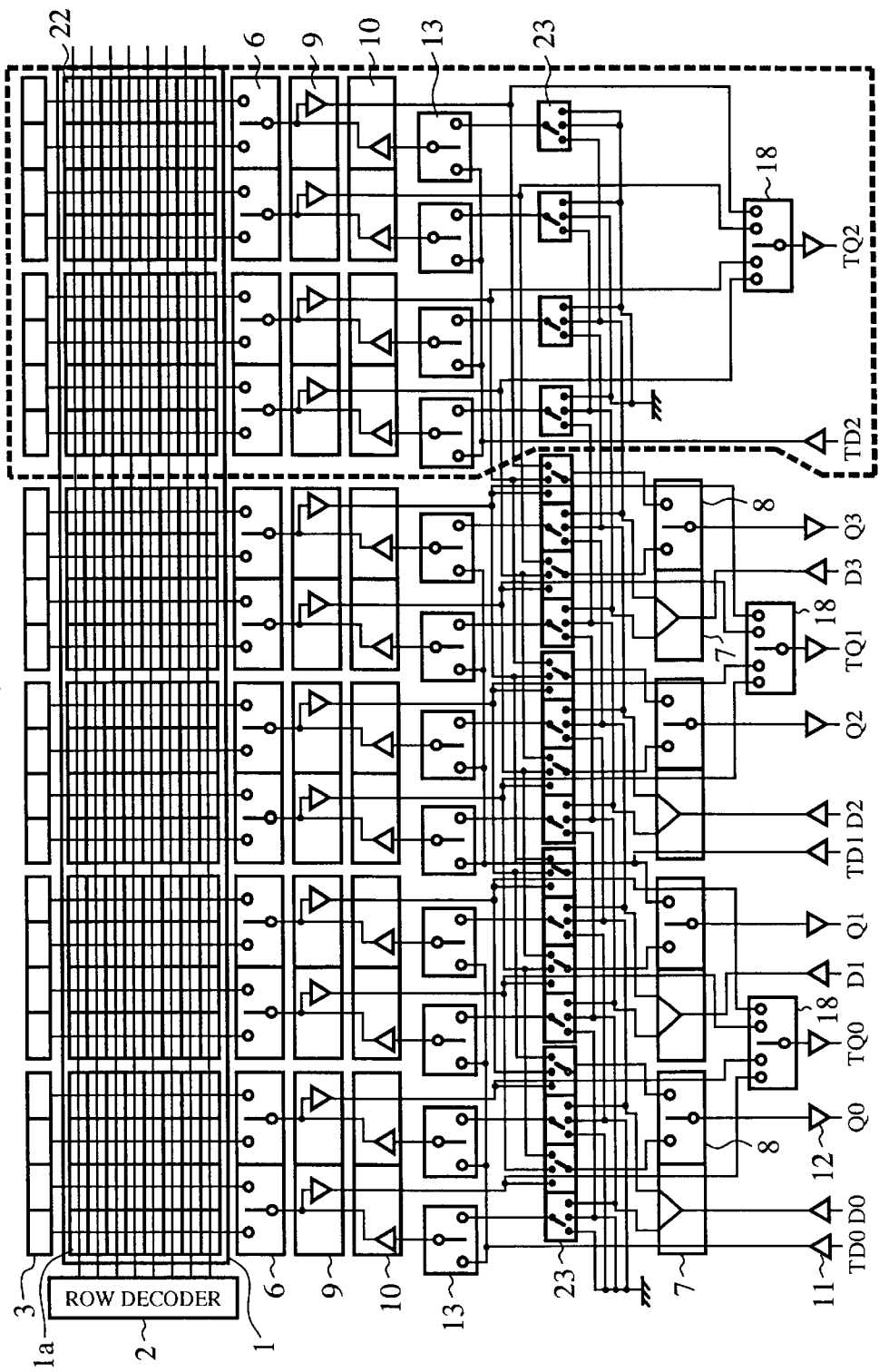
FIG. 7 is a block diagram of a memory core of a semiconductor data storing circuit device according to a fifth embodiment of the present invention.
Figure 8:
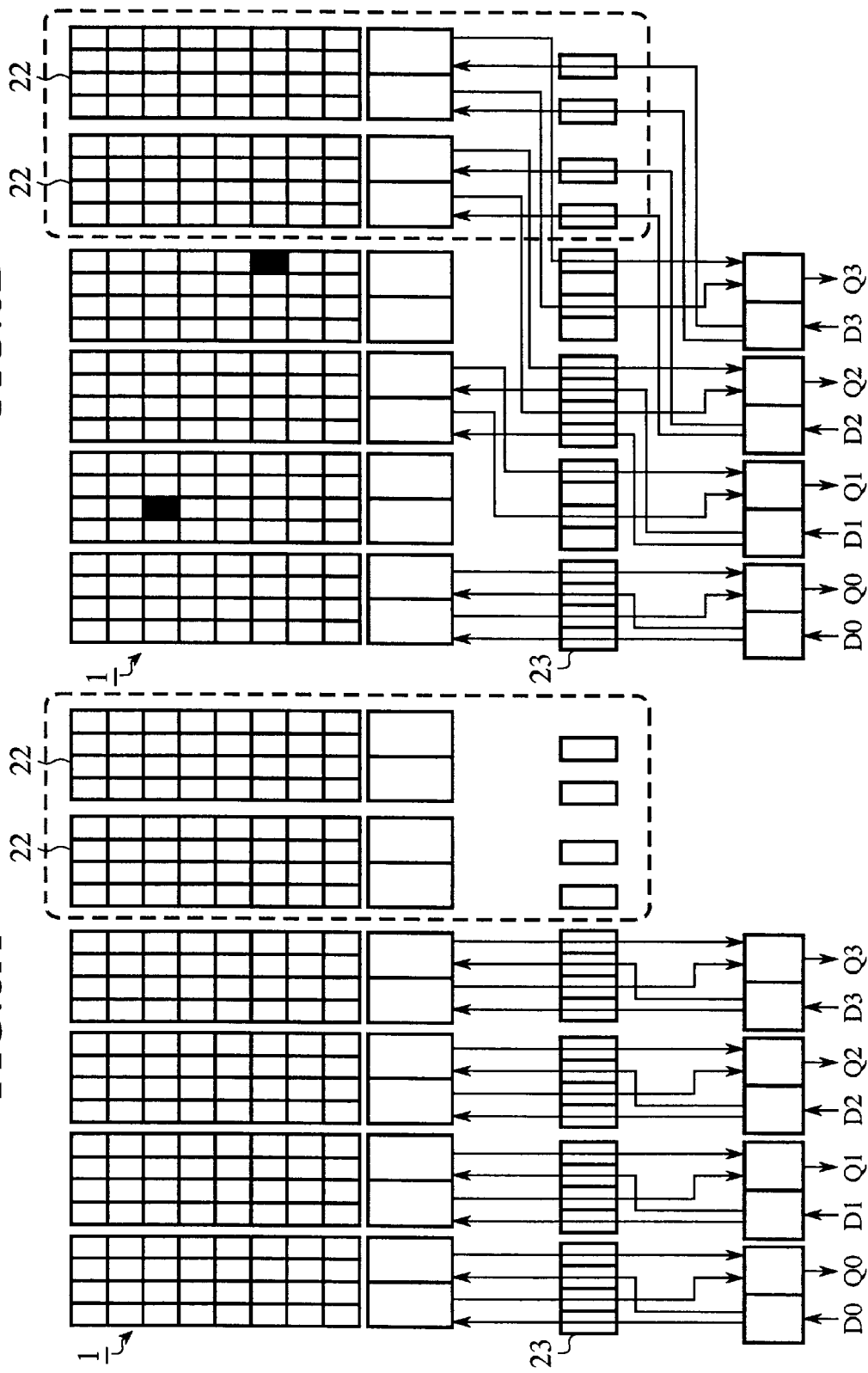
FIG. 8A is a view conceptually showing a data flow of a normal operation performed in the semiconductor data storing circuit device shown in FIG. 7 in case of no detection of a defective cell.
FIG. 8B is a view conceptually showing a data flow of a normal operation performed in the semiconductor data storing circuit device shown in FIG. 7 in cases where a plurality of defective cells are detected.

FIG. 7 is a block diagram of a memory core of a semiconductor data storing circuit device according to a fifth embodiment of the present invention. In FIG. 7, 1 indicates a memory cell array, 1a indicates each of a plurality of cells composing the memory cell array 1, 22 indicates a spare memory cell array having cells in a first block of four columns and cells in a second block of four columns, and 23 indicates each of a plurality of change-over circuits. The change-over circuits 23 change over from a block of four columns of the memory cell array 1 including a defective cell to one block of four columns of the spare memory cell array 22. The changing of cells in the change-over circuits 23 is performed every four columns. Also, the row decoder 2, the column decoders 4 and 5, the controller 14, the column address selector 15, the row address selector 16 and the column decoder 17, which are not shown in FIG. 7, are arranged in the memory core shown in FIG. 7. The other constituent elements such as the constituent elements of the data input/output circuit and the constituent elements of the checking circuit, which are the same as those shown in FIG. 1, are indicated by the same reference numerals as those indicated in FIG. 1, and additional description of those other constituent elements is omitted.

FIG. 8A is a view conceptually showing a data flow of a normal operation performed in the memory cell array 1 and the data input/output circuit shown in FIG. 7, and FIG. 8B is a view conceptually showing a data flow of a normal operation performed in the memory cell array 1, the spare memory cell array 22 and the data input/output circuit shown in FIG. 7 in cases where a plurality of defective cells are detected in the memory cell array 1.

In FIG. 7, FIG. 8A and FIG. 8B, the memory cell array 1 is set to the word-bit configuration of 32 words×4 bits in the normal operation because each bit of data passing through the data input/output circuit corresponds to four columns of the memory cell array 1. Also, in the test operation performed in the manufacturing of the memory cell array 1, each bit of data passing through the checking circuit corresponds to eight columns of the memory cell array 1, and the spare memory cell array 22, of which the eight columns correspond to one bit of test data in the test operation, is added for the test operation. Therefore, the memory cell array 1 is set to the word-bit configuration of 64 words×3 bits in the test operation. Also, the change-over circuits 23 change over from each block of four columns of the memory cell array 1 corresponding to one bit of data passing through the data input/output circuit to one block of four columns of the spare memory cell array 22. Therefore, two blocks in the memory cell array 1 can be relieved by using the spare memory cell array 22.

Next, an operation of the memory core shown in FIG. 7, FIG. 8A and FIG. 8B will be described.

In the test operation, when a first defective cell (indicated by a black square in FIG. 8B) placed at the sixth column (or the second block) of the memory cell array 1 and a second defective cell (indicated by another black square in FIG. 8B) placed at the sixteenth column (or the fourth block) of the memory cell array 1 are detected, a repair code is sent from the controller 14 (not shown) to the change-over circuits 23, the change-over circuits 23 change over from both the second block of four columns including the first defective cell and the fourth block of four columns including the second defective cell to two blocks of the spare memory cell array 22, and the memory cell array 1 is relieved from the defective cells. In this case, the connection of the data input/output pins D1 and Q1 with the second block of the memory cell array 1 is changed to the connection of the data input/output pins D1 and Q1 with the third block of the memory cell array 1, the connection of the data input/output pins D2 and Q2 with the third block of the memory cell array 1 is changed to the connection of the data input/output pins D2 and Q2 with the first block of the spare memory cell array 22, and the connection of the data input/output pins D3 and Q3 with the fourth block of the memory cell array 1 is changed to the connection of the data input/output pins D3 and Q3 with the second block of the spare memory cell array 22.

As is described above, in the fifth embodiment, the semiconductor data storing circuit device comprises the memory cell array 1 which is arranged in a memory core of a semiconductor chip and has a plurality of memory cells arranged in a plurality of rows and a plurality of columns, the data input/output circuit which is arranged in the memory core to be used in the normal operation of the memory cell array 1 and in which a data input line and a data output line for one bit of data are arranged at every first predetermined number of columns (for example, every four columns) of the memory cell array 1, the checking circuit which is arranged in the memory core to be used in the test operation performed in the manufacturing of the memory cell array 1 and in which a test data input line and a test data output line for one bit of test data are arranged at every second predetermined number of columns (for example, every eight columns) of the memory cell array 1, the spare memory cell array 22 which is arranged in the memory core to relieve the memory cell array 1 from defective cells placed at arbitrary columns of the memory cell array 1 and in which the number of columns is equal to the number of columns corresponding to one bit of test data passing through the checking circuit, and the change-over circuits 23 for changing a block of columns of the memory cell array 1, which includes each defective memory cell and of which the column number is equal to the number of columns corresponding to each bit of data in the data input/output circuit, to a block of columns of the spare memory cell array 22. Therefore, the memory cell array 1 can be relieved from the defective cell. Also, the test operation in the manufacturing of the memory cell array 1 can be performed without distinguishing each spare memory cell array 22 from the memory cell array 1. Also, the test operation can be performed before the relief of the memory cell array 1 from the defective cell, and effects resulting from the relief are increased.

Figure 9:
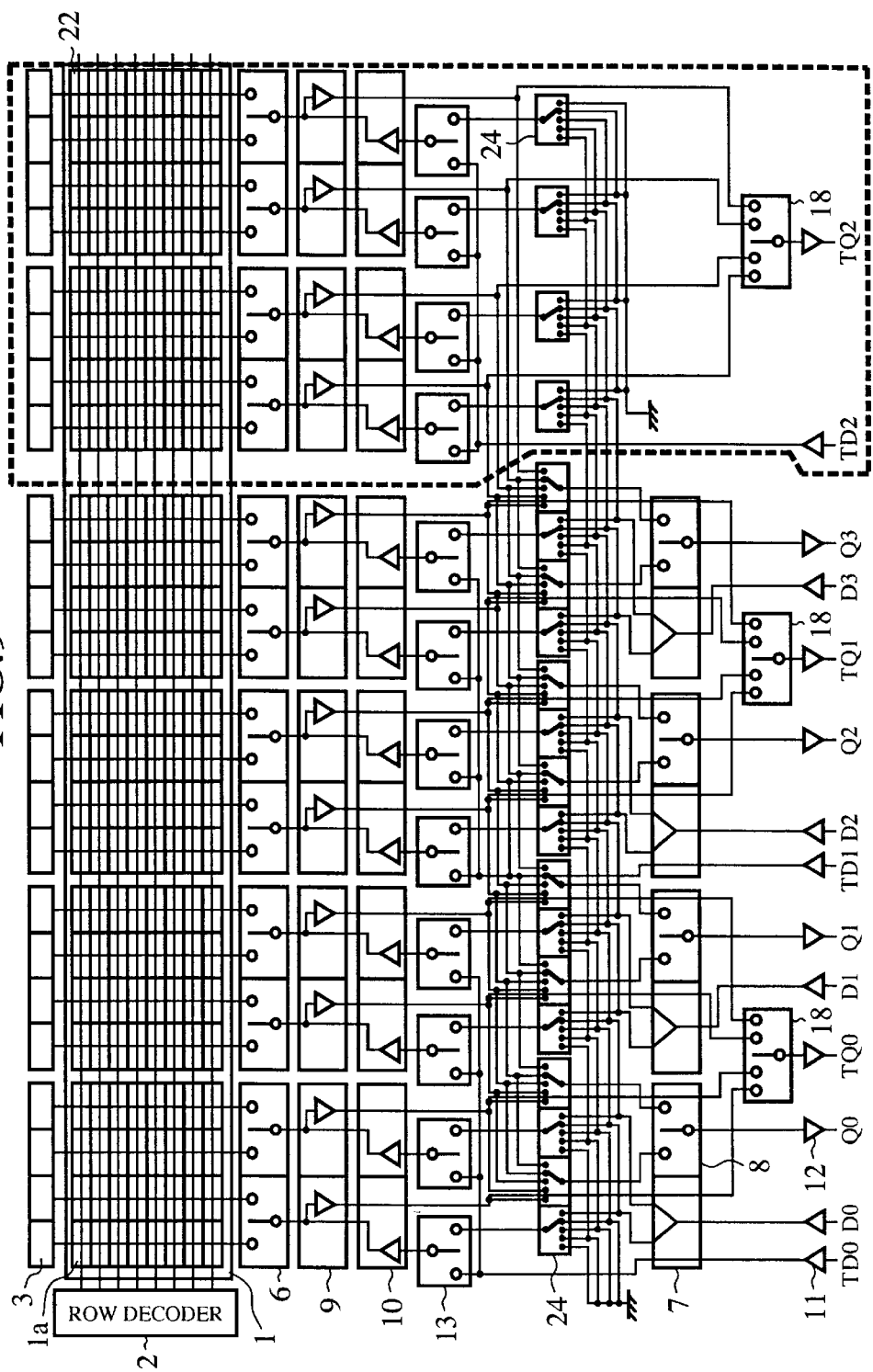
FIG. 9 is a block diagram of a memory core of a semiconductor data storing circuit device according to a modification of the fifth embodiment of the present invention.

FIG. 9 is a block diagram of a memory core of a semiconductor data storing circuit device according to a modification of the fifth embodiment of the present invention. In FIG. 9, 6 indicates each of the multiplexers (or first change-over circuits) directly connected with the memory cell array 1. 24 indicates each of a plurality of change-over circuits (or a second change-over circuit) The change-over circuits 24 change over from a block of two columns of the memory cell array 1 including a defective cell to a block of two columns of the spare memory cell array 22. The changing operation in the change-over circuits 24 is performed every two columns processed by one multiplexer 6 directly connected with the memory cell array 1. The multiplexers 6 and the other constituent elements such as the constituent elements of the data input/output circuit and the constituent elements of the checking circuit, which are the same as those shown in FIG. 7, are indicated by the same reference numerals as those indicated in FIG. 7, and additional description of those other constituent elements and the multiplexers 6 is omitted.

Figure 10:
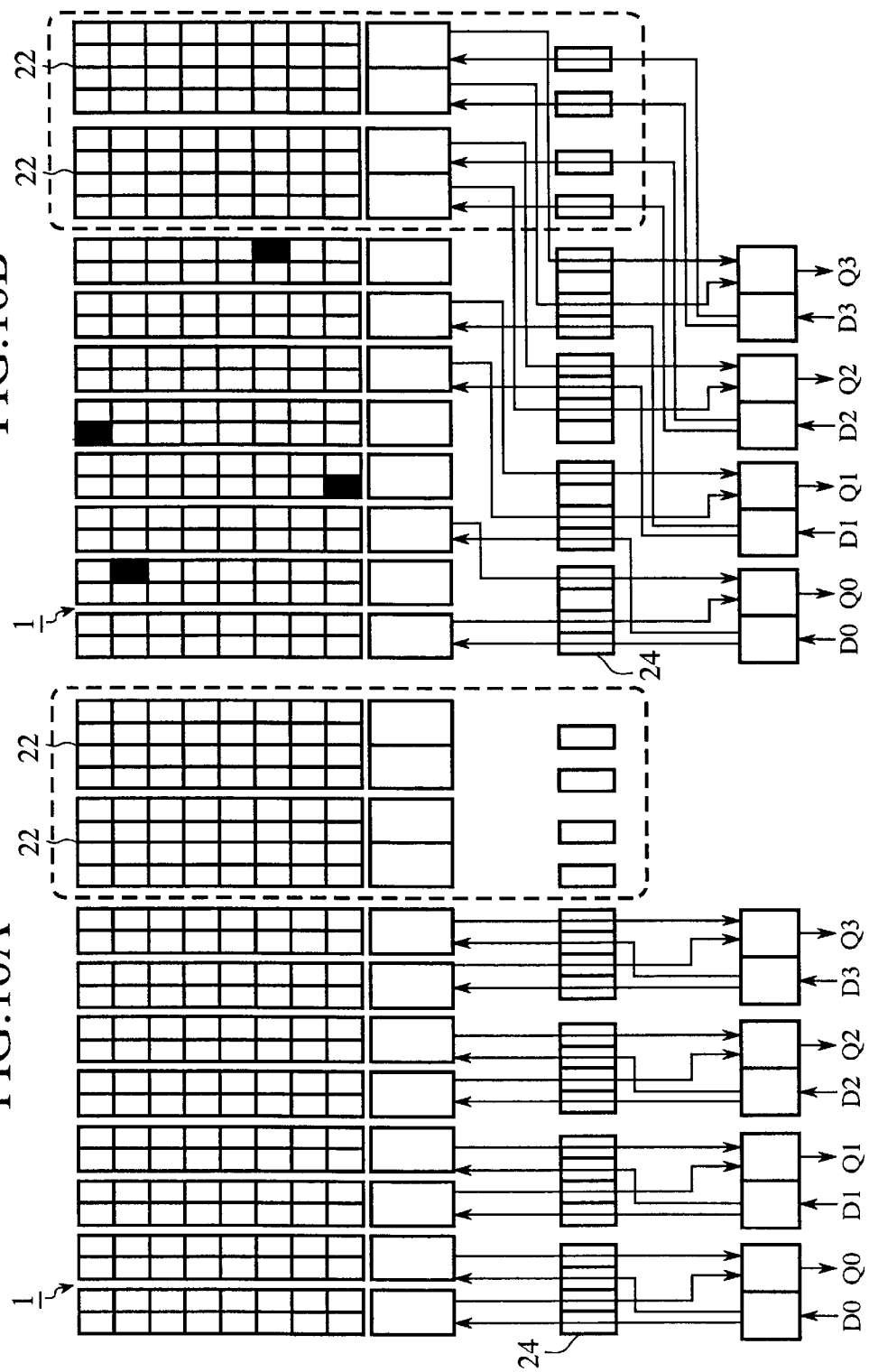
FIG. 10A is a view conceptually showing a data flow of a normal operation performed in the semiconductor data storing circuit device shown in FIG. 9 in case of no detection of a defective cell.
FIG. 10B is a view conceptually showing a data flow of a normal operation performed in the semiconductor data storing circuit device shown in FIG. 9 in cases where a plurality of defective cells are detected.

FIG. 10A is a view conceptually showing a data flow of a normal operation performed in the memory cell array 1 and the data input/output circuit shown in FIG. 9, and FIG. 10B is a view conceptually showing a data flow of a normal operation performed in the memory cell array 1, the spare memory cell array 22 and the data input/output circuit shown in FIG. 9 in cases where a plurality of defective cells are detected in the memory cell array 1.

In FIG. 9, FIG. 10A and FIG. 10B, the memory cell array 1 is set to the word-bit configuration of 32 words×4 bits in the normal operation because each bit of data passing through the data input/output circuit corresponds to four columns of the memory cell array 1. Also, in the test operation performed in the manufacturing of the memory cell array 1, each bit of data passing through the checking circuit corresponds to eight columns of the memory cell array 1, and the spare memory cell array 22, of which the eight columns correspond to one bit of test data in the test operation, is added for the test operation. Therefore, the memory cell array 1 is set to the word-bit configuration of 64 words×3 bits in the test operation. Also, the change-over circuits 24 change each block of two columns of the memory cell array 1 corresponding to one multiplexer 6 to another block of two columns of the spare memory cell array 22. Therefore, four blocks of the memory cell array 1 can be relieved by using the spare memory cell array 22.

Next, an operation of the memory core shown in FIG. 9, FIG. 10A and FIG. 10B will be described.

In the test operation, in cases where a plurality of defective cells (indicated by black squares in FIG. 8B) placed at the second block (the fourth column), the fourth block (the seventh column), the fifth block (the ninth column) and the eighth block (the sixteenth column) of the memory cell array 1 are detected, a repair code is sent from the controller 14 (not shown) to the change-over circuits 24, the change-over circuits 24 change each block of two columns including the defective cell to one block of two columns of the spare memory cell array 22, and the memory cell array 1 is relieved from the defective cells.

As is described above, in the modification of the fifth embodiment, the semiconductor data storing circuit device comprises the memory cell array 1 which is arranged in a memory core of a semiconductor chip and has a plurality of memory cells arranged in a plurality of rows and a plurality of columns, the data input/output circuit which is arranged in the memory core to be used in the normal operation of the memory cell array 1 and in which a data input line and a data output line for one bit of data are arranged at every first predetermined number of columns (for example, every four columns) of the memory cell array 1, the checking circuit which is arranged in the memory core to be used in the test operation performed in the manufacturing of the memory cell array 1 and in which a test data input line and a test data output line for one bit of test data are arranged at every second predetermined number of columns (for example, every eight columns) of the memory cell array 1, the spare memory cell array 22 which is arranged in the memory core to relieve the memory cell array 1 from defective cells placed at arbitrary columns of the memory cell array 1 and in which the number of columns is equal to the number of columns corresponding to one bit of test data passing through the checking circuit, and the change-over circuits 24 for changing a block of columns of the memory cell array 1, which includes each defective memory cell and of which the column number is equal to the number of columns (that is, two) processed by one multiplexer 6, to a block of two columns of the spare memory cell array 22. Therefore, the memory cell array 1 can be relieved from the defective cells. Also, the test operation in the manufacturing of the memory cell array 1 can be performed without distinguishing the spare memory cell array 22 from the memory cell array 1. Also, the test operation can be performed before the relief of the memory cell array 1 from the defective cell, and the effects resulting from the relief are increased. Also, because the number of blocks of columns of the memory cell array 1 relieved by the spare memory cell array 22 is high, effects resulting from the relief are further increased.

Embodiment 6

Figure 11:
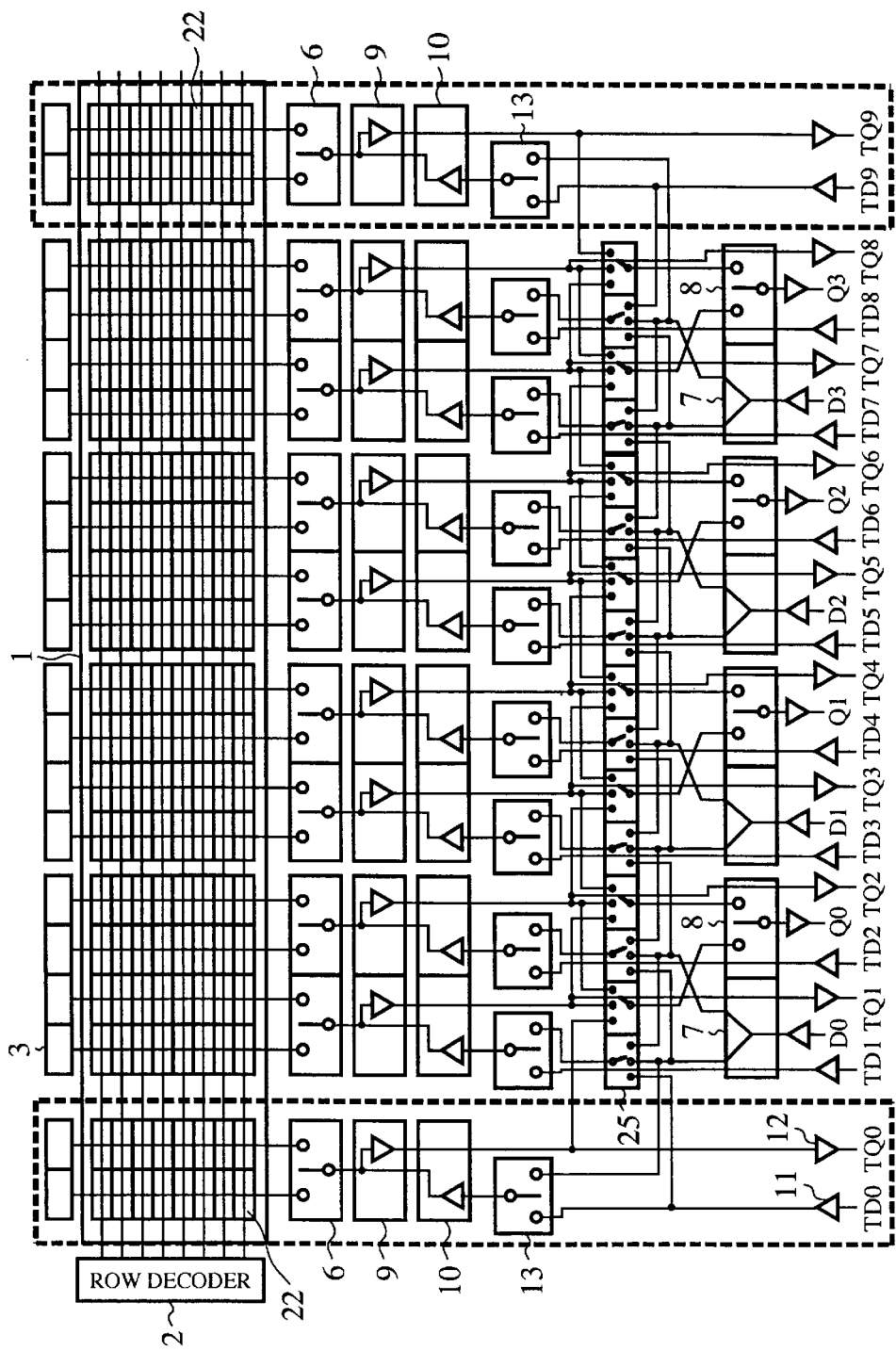
FIG. 11 is a block diagram of a memory core of a semiconductor data storing circuit device according to a sixth embodiment of the present invention.

FIG. 11 is a block diagram of a memory core of a semiconductor data storing circuit device according to a sixth embodiment of the present invention. In FIG. 11, 22 indicates a spare memory cell array having both a first block of two columns and a second block of two columns. The first block of two columns in the spare memory cell array 22 is placed on the left side of the memory cell array 1, and the second block of two columns in the spare memory cell array 22 is placed on the right side of the memory cell array 1. 25 indicates each of a plurality of change-over circuits. The change-over circuits 25 change over from a block of two columns of the memory cell array 1 including a defective cell to one block of two columns of the spare memory cell array 22. The changing of cells in the change-over circuits 25 is performed every two columns processed by one multiplexer 6 directly connected with the memory cell array 1. TD0 to TD9 indicate test data input pins from which test data is input. TQ0 to TQ9 indicate test data output pins from which test data is output. Also, the row decoder 2, the column decoders 4 and 5, the controller 14, the column address selector 15 and the row address selector 16, which are not shown in FIG. 11, are arranged in the memory core shown in FIG. 11. The other constituent elements such as the constituent elements of the data input/output circuit and the constituent elements of the checking circuit, which are the same as those shown in FIG. 1, are indicated by the same reference numerals as those indicated in FIG. 1, and additional description of those other constituent elements is omitted.

Figure 12B:
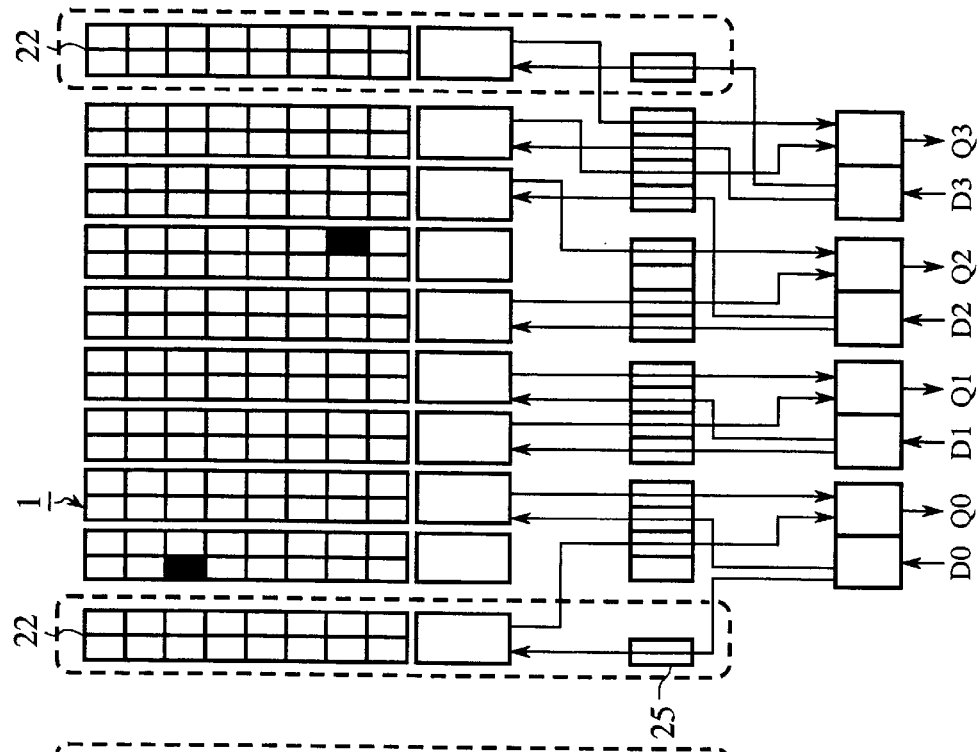
FIG. 12B is a view conceptually showing a data flow of a normal operation performed in the semiconductor data storing circuit device shown in FIG. 11 in cases where a plurality of defective cells are detected.
Figure 12A:
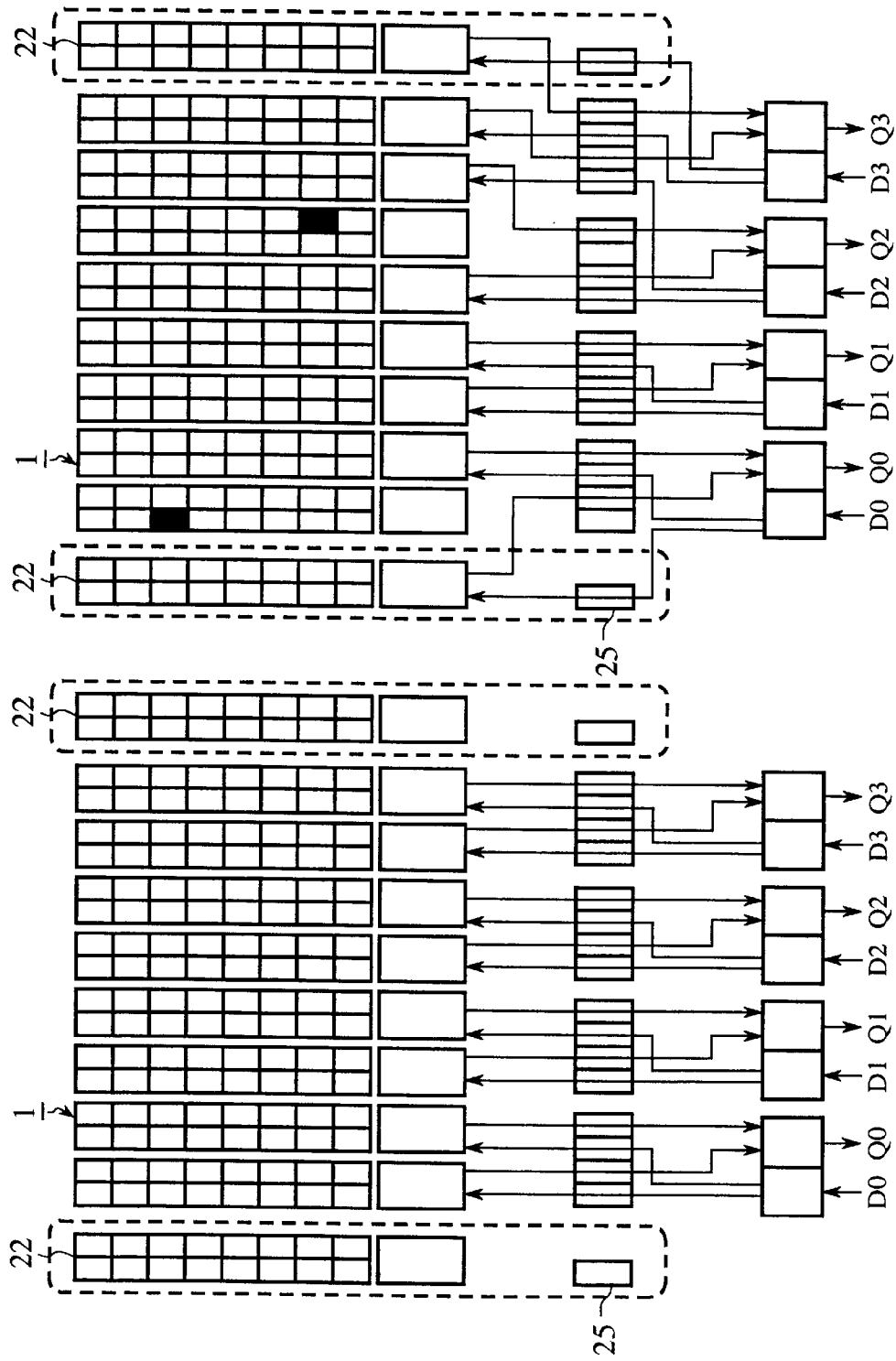
FIG. 12A is a view conceptually showing a data flow of a normal operation performed in the semiconductor data storing circuit device shown in FIG. 11 in case of no detection of a defective cell.

FIG. 12A is a view conceptually showing a data flow of a normal operation performed in the memory cell array 1 and the data input/output circuit shown in FIG. 11, and FIG. 12B is a view conceptually showing a data flow of a normal operation performed in the memory cell array 1, the spare memory cell array 22 and the data input/output circuit shown in FIG. 11 in cases where a plurality of defective cells are detected in the memory cell array 1.

In FIG. 11, FIG. 12A and FIG. 12B, the memory cell array 1 is set to the word-bit configuration of 32 words×4 bits in the normal operation because each bit of data passing through the data input/output circuit corresponds to four columns of the memory cell array 1. Also, in the test operation performed in the manufacturing of the memory cell array 1, each bit of data passing through the checking circuit corresponds to two columns of the memory cell array 1, and the spare memory cell array 22, which has a plurality of columns denoting N times (N is a positive integral number) of two columns corresponding to one bit of data passing through the checking circuit. In the case shown in FIG. 11, the spare memory cell array 22 has four columns denoting twice of two columns. Therefore, the memory cell array 1 is set to the word-bit configuration of 16 words×10 bits in the test operation for the manufacturing of the memory cell array 1. Also, the change-over circuits 25 change each block of two columns of the memory cell array 1 corresponding to one multiplexer 6 to another block of two columns of the spare memory cell array 22. Therefore, two blocks of the memory cell array 1 can be relieved by using the spare memory cell array 22.

Next, an operation of the memory core shown in FIG. 11, FIG. 12A and FIG. 12B will be described.

In cases where an operation mode changing signal input to the controller 14 not shown indicates a normal operation mode, a write mode operation is performed in the same manner as in the second embodiment. That is, four bits of data input to the data input pin D0 to D3 are simultaneously written in four specific cells of the memory cell array 1 through the input buffers 11, the demultiplexers 7, the change-over circuits 25, the multiplexers 13, the write drivers 10 and the multiplexers 6. The writing of the bits of data is repeatedly performed. In contrast, in a read mode operation, four bits of data stored in four specific cells of the memory cell array 1 are read out to the data output pins Q0 to Q3 through the multiplexers 6, the sense amplifiers 9, the change-over circuits 25, the multiplexers 8 and the output buffers 12, and the four bits of data are output from the data output pins Q0 to Q3. The reading-out of the bits of data is repeatedly performed.

Also, in cases where the operation mode changing signal input to the controller 14 not shown indicates a test operation mode, in a write mode operation, ten bits of test data input to the test data input pins TD0 to TD9 are simultaneously written in ten specific cells through the input buffers 11, the multiplexers 13, the write drivers 10 and the multiplexers 6. In contrast, in a read mode operation, ten bits of data stored in ten specific cells are simultaneously read out to the test data output pins TQ0 to TQ9 through the multiplexers 6, the sense amplifiers 9, the multiplexers 13 and the output buffers 12.

In the test operation, in cases where a plurality of defective cells (indicated by black squares in FIG. 12B) placed at the first and sixth blocks (the first and twelfth columns) of the memory cell array 1 are detected, a repair code is sent from the controller 14 (not shown) to the change-over circuits 25, the change-over circuits 25 change over from each block of two columns including the defective cell to one block of two columns of the spare memory cell array 22, and the memory cell array 1 is relieved from the defective cells. In this case, because the blocks of the spare memory cell array 22 are arranged on both sides of the memory cell array 1 respectively, the connection of a pair of data input/output pins with a left-side (or a right-side) defective block including a left-side (or a right-side) defective column in the memory cell array 1 is changed by the change-over circuit 25 to the connection of the pair of data input/output pins with another block placed on the left (or right) side of the left-side (or the right-side) defective block by one bit, and the connection of each pair of data input/output pins with an original block placed on the left (or right) side of the left-side (or the right-side) defective block in the memory cell array 1 is changed by the change-over circuit 25 to the connection of the pair of data input/output pins with another block placed on the left (or right) side of the original block by one bit.

As is described above, in the sixth embodiment, the semiconductor data storing circuit device comprises the memory cell array 1 which is arranged in a memory core of a semiconductor chip and has a plurality of memory cells arranged in a plurality of rows and a plurality of columns, the data input/output circuit which is arranged in the memory core to be used in the normal operation of the memory cell array 1 and in which a data input line and a data output line for one bit of data are arranged at every first predetermined number of columns (for example, every four columns) of the memory cell array 1, the checking circuit which is arranged in the memory core to be used in the test operation performed in the manufacturing of the memory cell array 1 and in which a data input line and a data output line for one bit of data are arranged at every second predetermined number of columns (for example, every two columns) of the memory cell array 1 on condition that the second predetermined number of columns is lower than the first predetermined number of columns, the spare memory cell array 22 which is arranged in the memory core to relieve the memory cell array 1 from defective cells placed at arbitrary columns of the memory cell array 1 and in which the number of columns (that is, four columns) is N times (N is a positive integral number) of the number of columns (that is, two columns) of the memory cell array 1 corresponding to one bit of data passing through the checking circuit in the manufacturing of the memory cell array 1, and the change-over circuits 25 for changing a block of columns of the memory cell array 1 including a defective cell, of which the column number is equal to the number of columns (that is, two columns) processed by one multiplexer 6, to one block of two columns of the spare memory cell array 22. Therefore, the memory cell array 1 can be relieved from the defective cells.

Also, the test operation in the manufacturing of the memory cell array 1 can be performed without distinguishing the spare memory cell array 22 from the memory cell array 1. Also, because the number of circuit elements in the checking circuit is lower than that in the data input/output circuit, a test operation speed in the memory core is higher than a normal operation speed. Therefore, the memory cell array 1 can be relieved from a failure due to the normal operation speed.

Embodiment 7

Figure 13:
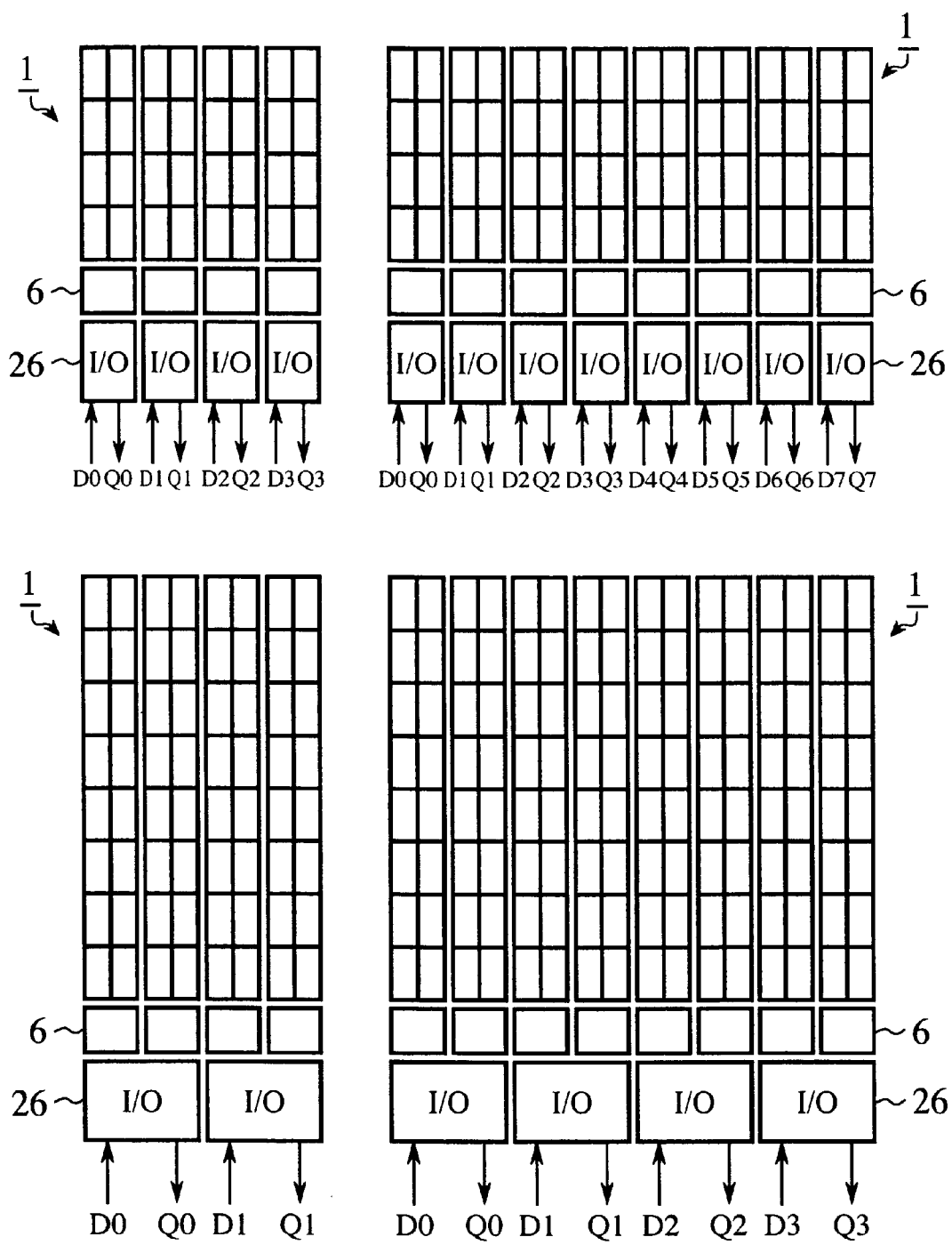
FIG. 13 is a view conceptually showing a semiconductor data storing circuit device according to a seventh embodiment of the present invention.

FIG. 13 is a view conceptually showing a semiconductor data storing circuit device according to a seventh embodiment of the present invention. In FIG. 13, 1 indicates each of four memory cell arrays of four memory cores formed on a semiconductor chip. 6 indicates each of a plurality of multiplexers respectively corresponding to two columns of each memory cell array 1. 26 indicates each of a plurality of data input/output circuits respectively composed of a sense amplifier, a write driver, a multiplexer, a demultiplexer, an input buffer and an output buffer. D0 to Dn (N=3, 7 or 1) indicate data input pins. Q0 to Qn indicate data output pins.

As shown in FIG. 13, a combination of the number of rows and the number of columns in each memory cell array 1 differs from those in the other memory cell arrays 1. The maximum number of rows is equal to 8, and the maximum number of columns is equal to 16. Also, a row decoder, column decoders, a controller, a column address selector and a row address selector, which are not shown in FIG. 13, are arranged in each memory core to specify memory cells of each memory cell array 1.

FIG. 14 is a view conceptually showing a semiconductor data storing circuit device in which a block of spare memory cell array is additionally arranged on both sides of each memory cell array 1 shown in FIG. 13. In FIG. 14, 22 indicates each of two blocks of spare memory cell array arranged on both sides of each memory cell array 1 respectively. The number of rows in each spare memory cell array 22 is equal to that in the corresponding memory cell array 1, and the number of columns in each spare memory cell array 22 is equal to 4. Also, two multiplexers 6 and two data input/output circuit 26 corresponding to each spare memory cell array 22 are arranged in the semiconductor storing circuit. Also, a row decoder, column decoders, a controller, a column address selector and a row address selector, which are not shown in FIG. 14, are arranged in each memory core to specify memory cells of each memory cell array 1 and spare memory cell array 22. The other configuration is the same as that shown in FIG. 13.

Figure 15:
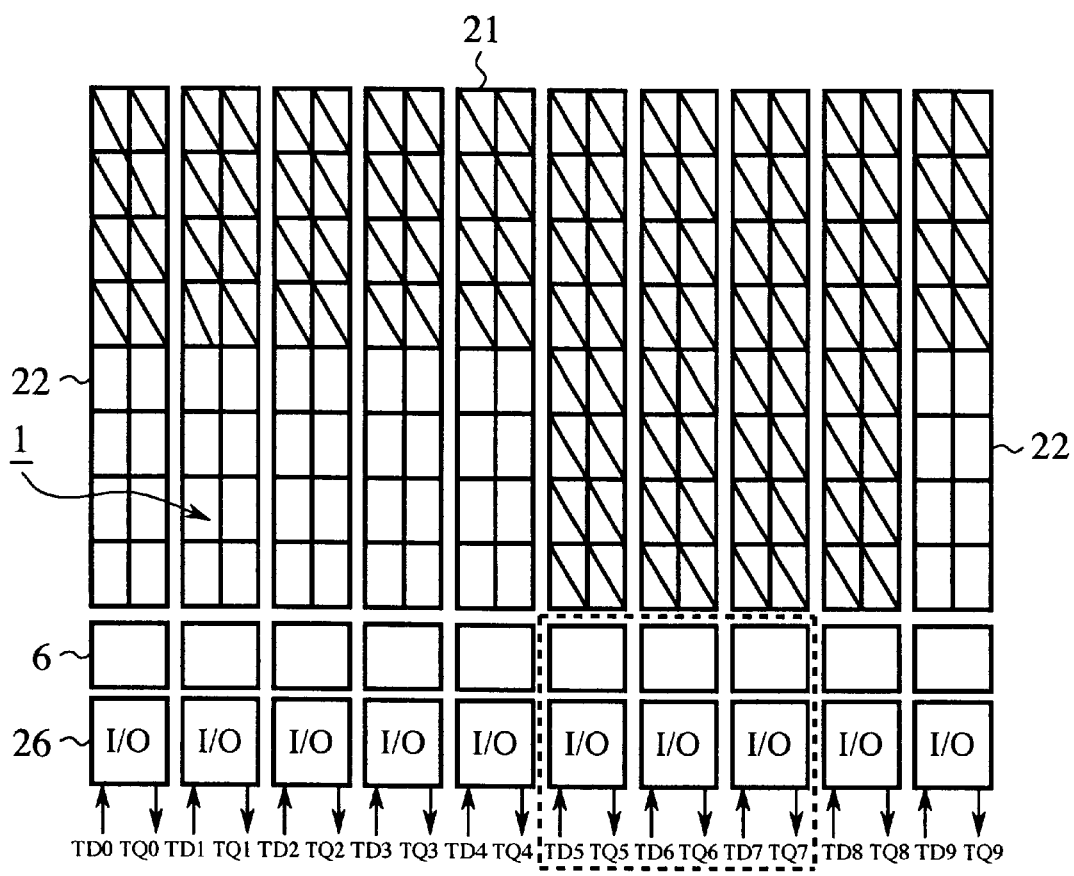
FIG. 15 is a view conceptually showing a memory core in which a virtual memory cell array is added to one memory cell array shown in FIG. 14.
Figure 16:
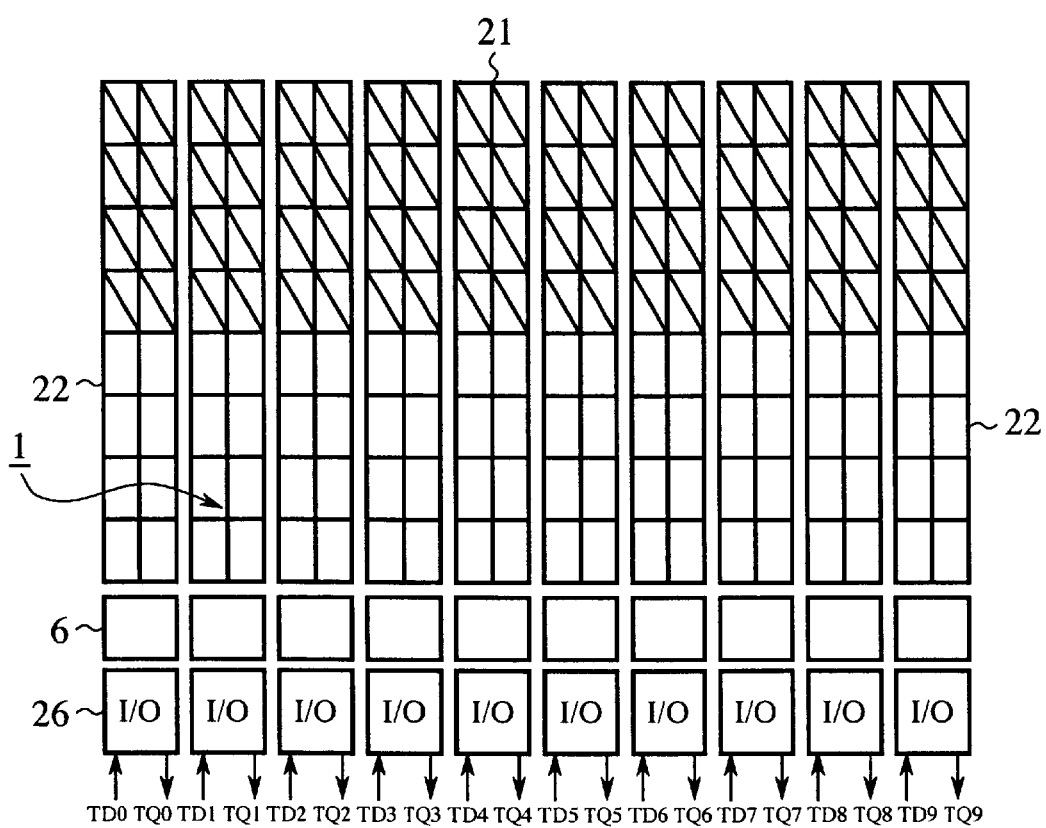
FIG. 16 is a view conceptually showing a memory core in which a virtual memory cell array is added to one memory cell array shown in FIG. 14.
Figure 17:
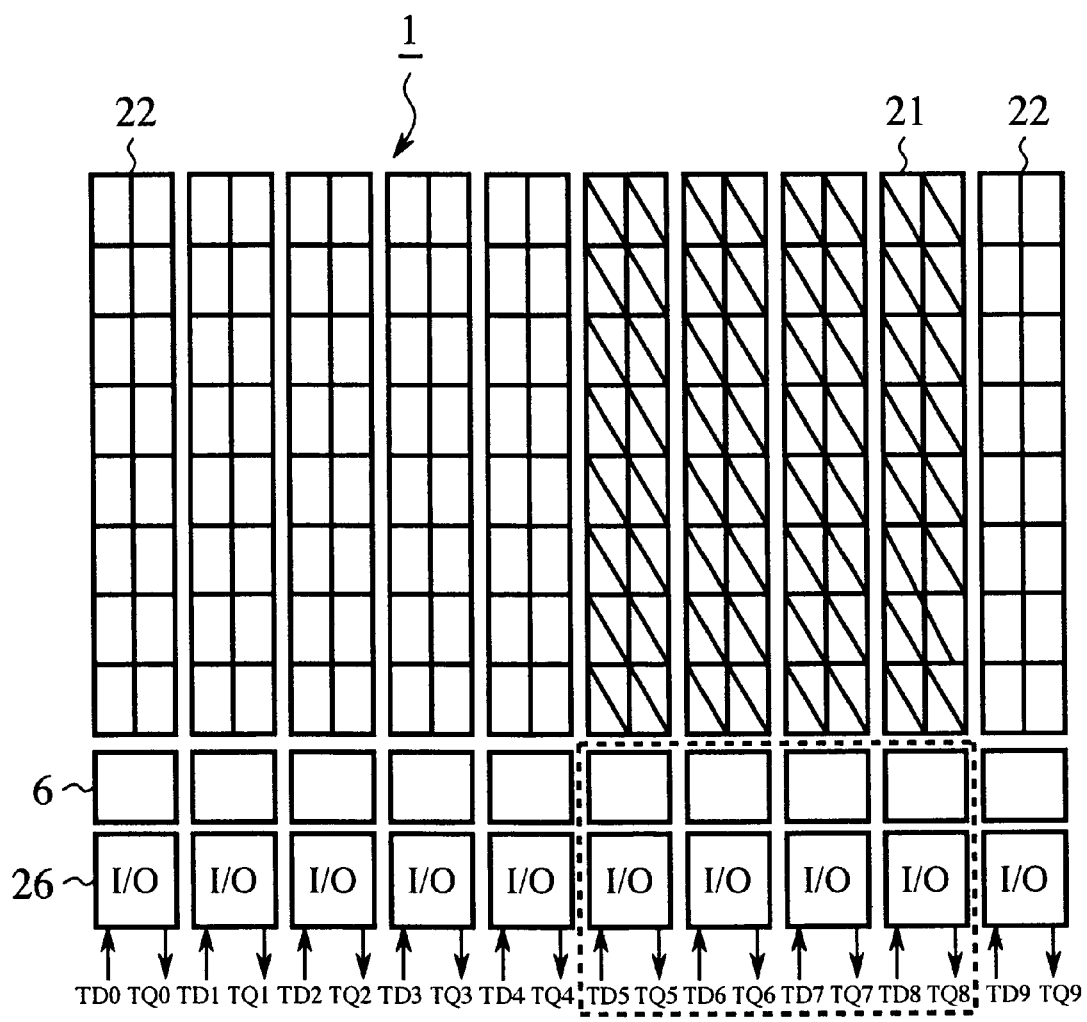
FIG. 17 is a view conceptually showing a memory core in which a virtual memory cell array is added to one memory cell array shown in FIG. 14.
Figure 18:
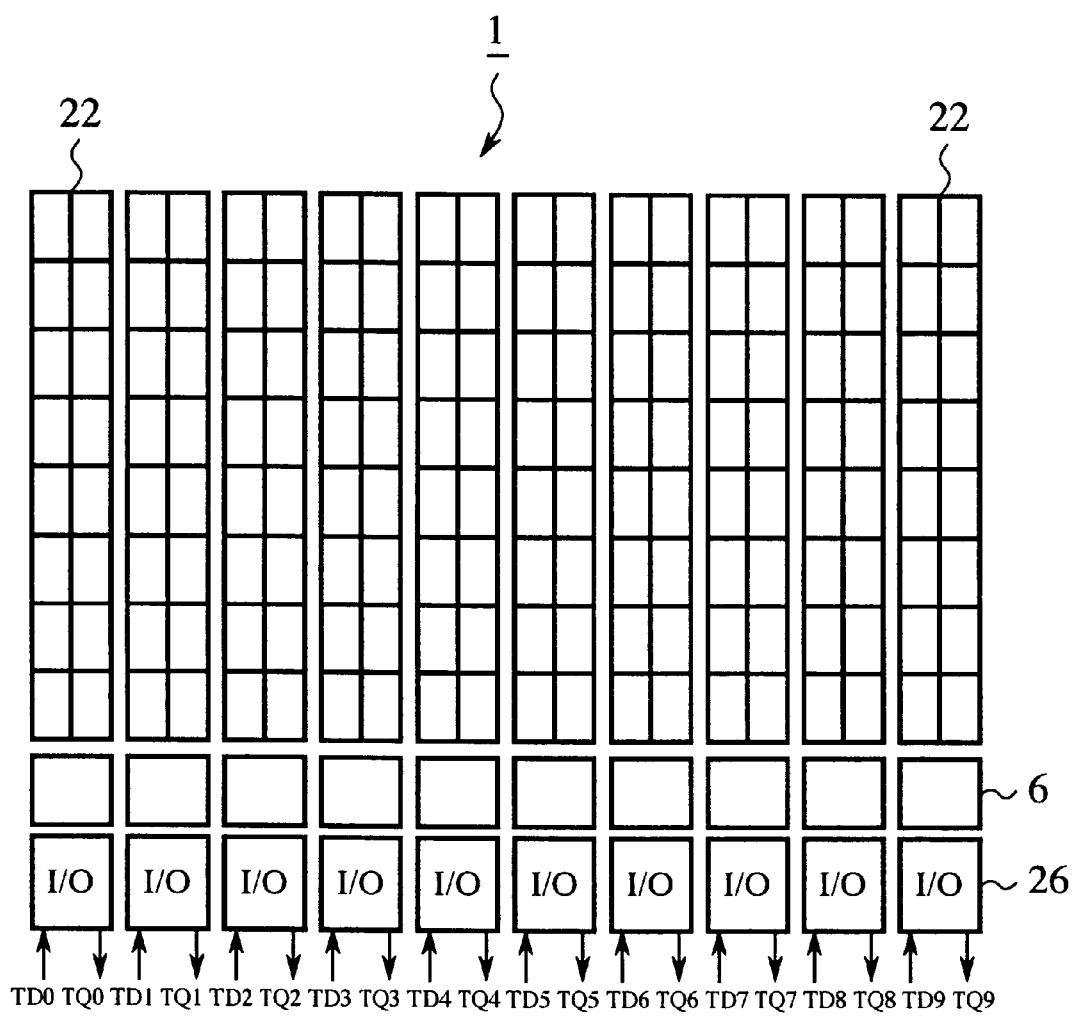
FIG. 18 is a view conceptually showing a memory core in which no virtual memory cell array is added to one memory cell array shown in FIG. 14.
Figure 19:
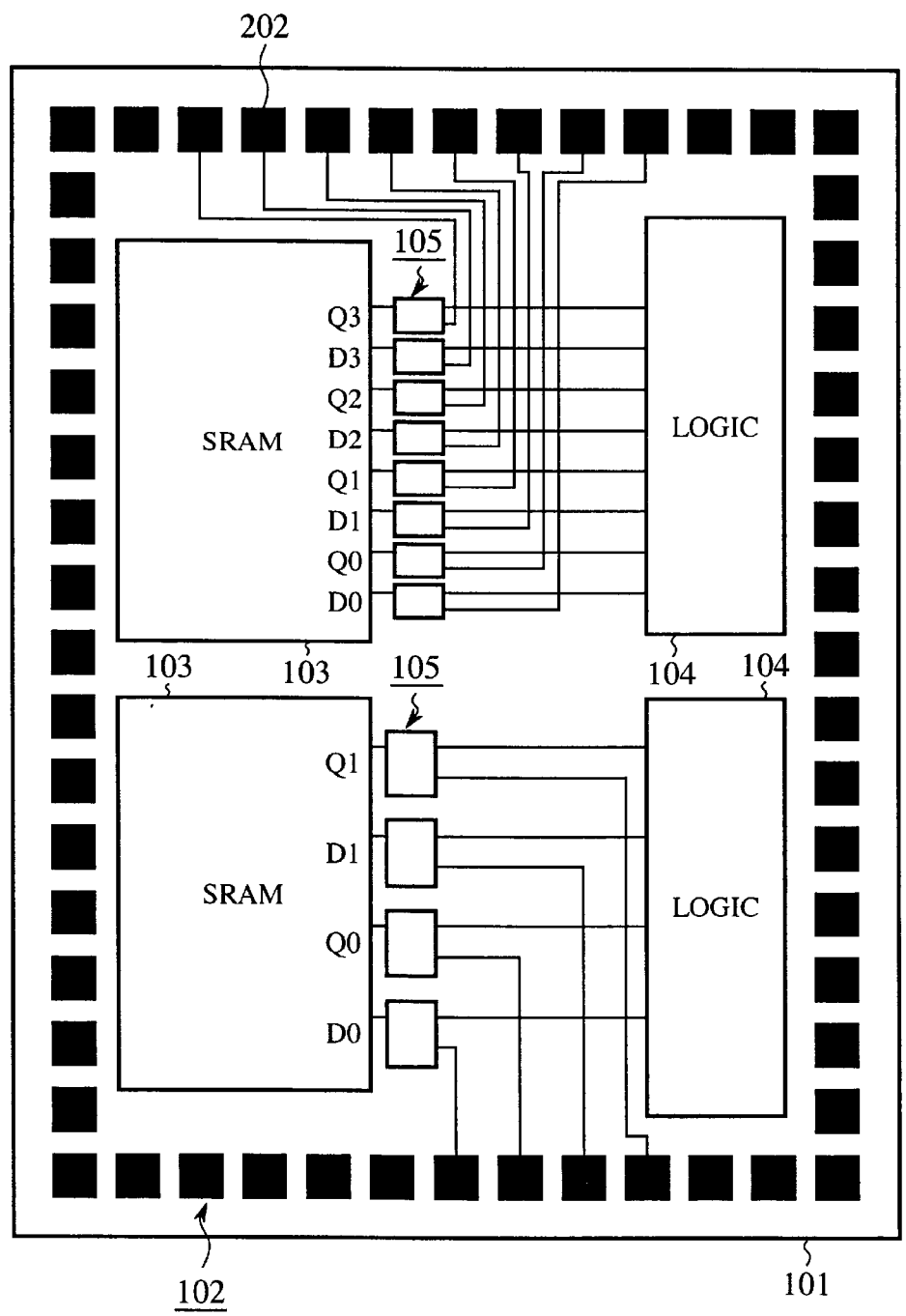
FIG. 19 is a block diagram showing the configuration of a system LSI in which a plurality of SRAM cores are arranged.
Figure 20:
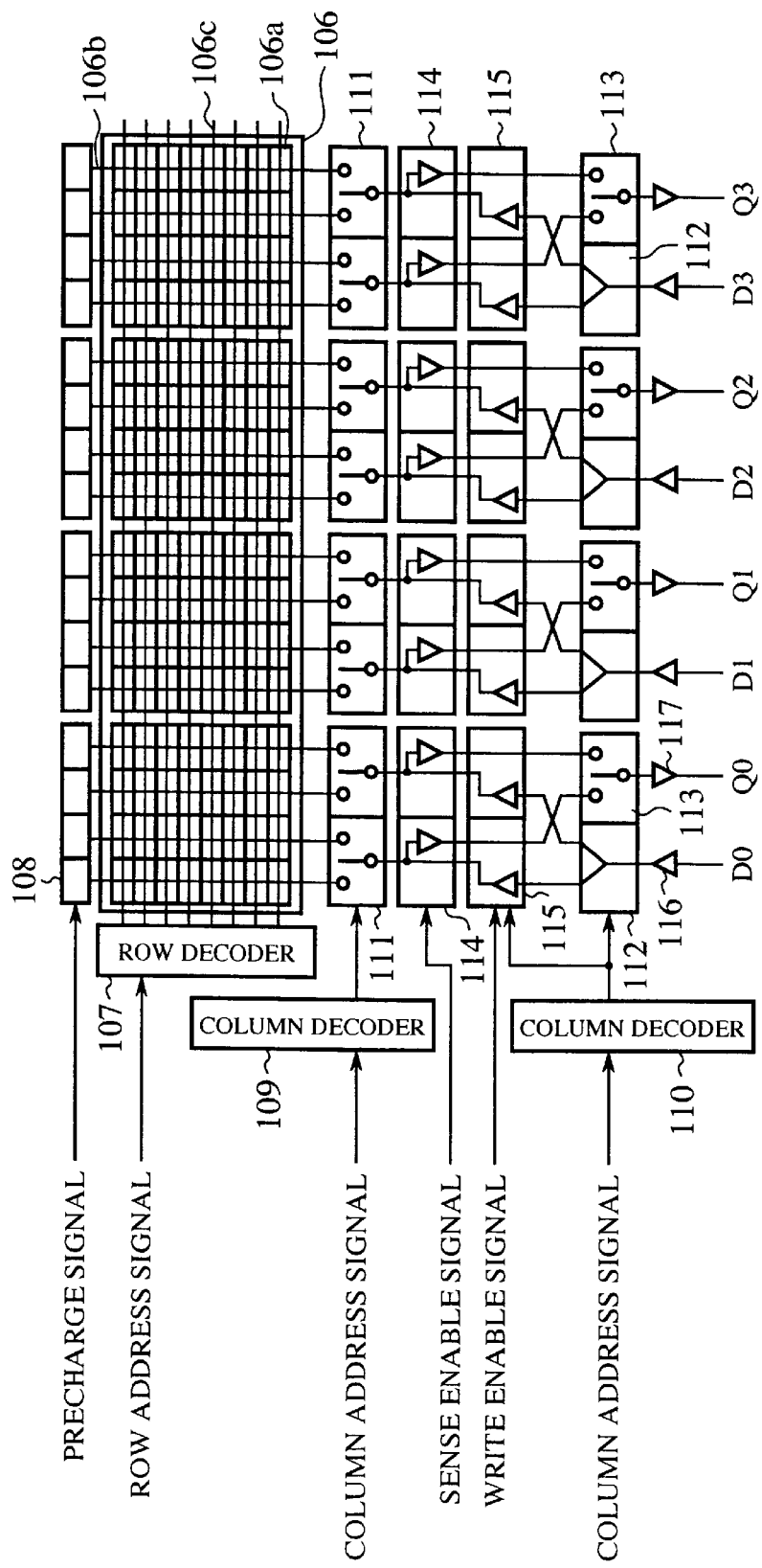
FIG. 20 is a block diagram showing the configuration of each memory core shown in FIG. 19.

FIG. 15 to FIG. 17 are views conceptually showing memory cores in which virtual memory cell arrays are added to the memory cell arrays 1 shown in FIG. 14 respectively, and FIG. 18 is a view conceptually showing a memory core in which no virtual memory cell array is added to one memory cell array shown in FIG. 14.

In FIG. 15 to FIG. 18, 21 indicates a virtual memory cell array added to each memory cell array 1. TD0 to TD9 indicate test data input pins, and TQ0 to TQ9 indicate test data output pins. Because the virtual memory cell array 21 is added to each memory cell array 1, each memory cell array 1 has a virtual cell configuration in which the number of columns is equal to 20 and the number of rows is equal to 8. Here, as shown in FIG. 15 and FIG. 17, a group of data input/output circuits 26 surrounded by each dotted line does not actually exist because all cells corresponding to the group of data input/output circuits 26 virtually exist.

Next, an operation of the semiconductor data storing circuit device according to the seventh embodiment will be described.

In cases where an operation mode changing signal input to a controller not shown indicates a normal operation mode, a write mode operation is performed in the semiconductor data storing circuit device shown in FIG. 13. That is, (n+1) bits (n=3, 7 or 1) of data input to the data input pin D0 to Dn are simultaneously written in (n+1) specific cells of each memory cell array 1 through the data input/output circuits 26 and the multiplexers 6. In contrast, in a read mode operation, (n+1) bits of data stored in (n+1) specific cells of the memory cell array 1 are read out to the data output pins Q0 to Qn through the multiplexers 6 and the data input/output circuits 26, and the (n+1) bits of data are output from the data output pins Q0 to Qn.

Also, in cases where the operation mode changing signal input to a controller not shown indicates a test operation mode, a write mode operation is performed in the memory cores shown in FIG. 15 to FIG. 18. That is, ten bits of test data input to the test data input pins TD0 to TD9 are simultaneously written in ten specific cells through the data input/output circuits 26 and the multiplexers 6. In contrast, in a read mode operation, ten bits of data stored in ten specific cells are simultaneously read out to the test data output pins TQ0 to TQ9 through the multiplexers 6 and the data input/output circuits 26. In cases where a defective dell or a plurality of defective cells are detected in the test operation, each block of two columns including a defective cell is replaced with one block of two columns of the spare memory cell array 22.

As is described above, in the seventh embodiment, the semiconductor data storing circuit device comprises a plurality of memory cores arranged in the same semiconductor chip on condition that a combination of the number of rows or the number of columns in the memory cell array 1 of each memory core differs from those in the memory cell arrays 1 of the other memory cores. Each memory core comprises the memory cell array 1 which has a plurality of memory cells arranged in a plurality of rows and a plurality of columns, the data input/output circuits which are used in the normal operation and in which a data input line and a data output line for one bit of data are arranged at every predetermined number of columns (for example, two columns) of the memory cell array 1, the checking circuit which is arranged to be used in the test operation performed in the manufacturing of the memory cell array 1 and in which a test data input line and a test data output line for one bit of test data are arranged at every fixed number of columns of the memory cell array 1 regardless of the predetermined number of columns corresponding the data input/output lines for one bit of data in the data input/output circuit on condition that the fixed number of columns is common to all memory cores, and the spare memory cell array 22 which is arranged to relieve the memory cell array 1 from defective cells placed at arbitrary columns of the memory cell array 1 and in which the number of columns is equal to N times (N is a positive integral number) of the fixed number of columns corresponding to one bit of test data passing through the checking circuit. That is, the number of columns corresponding to one bit passing through each checking circuit is fixed for all memory cores, and the number of columns in each spare memory cell array 22 is fixed for all memory cores.

Accordingly, because all memory cores virtually have the same cell configuration as each other in the test operation of the memory cell arrays 1, all memory cores can be checked according to the same checking program in the manufacturing of the memory cell arrays 1. That is, even though a plurality of memory cores of the semiconductor data storing circuit device are actually arranged on the same semiconductor chip on condition that a combination of the number of rows, the number of columns, the number of bits or the number of words in each memory cell array 1 differs from those in the other memory cell arrays 1, the configuration of the number of data input/output circuits including the virtual data input/output circuits is fixed for all memory cores, and the configuration of the spare memory cell array 22 is fixed for all memory cores. Therefore, all memory cores can be checked according to the same checking program.

In the above configurations, a (test) data input line and a (test) data output line for one bit of (test) data are arranged at every predetermined number of columns. However, it is applicable that a (test) data input line or a (test) data output line for one bit of (test) data be arranged at every predetermined number of columns.

What is claimed is:

1. A semiconductor data storing circuit device, comprising:
    a memory cell array which is arranged in a memory core of a semiconductor chip and has a plurality of memory cells arranged in a row or a plurality of rows and a plurality of columns;
    a data input/output circuit which is arranged in the memory core to be used in a normal operation of the memory cell array and in which a data input line or/and a data output line for each bit of data is/are arranged at every first predetermined number of columns of the memory cell array; and
    a checking circuit which is arranged in the memory core to be used in a test operation performed in manufacturing of the memory cell array and in which a test data input line or/and a test data output line for each bit of test data is/are arranged at every second predetermined number of columns of the memory cell array on condition that the second predetermined number of columns differs from the first predetermined number of columns.

2. The semiconductor data storing circuit device according to claim 1, wherein the second predetermined number of columns corresponding to the test data input line or/and the test data output line of the checking circuit is higher than the first predetermined number of columns corresponding to the data input line or/and the data output line of the data input/output circuit.

3. The semiconductor data storing circuit device according to claim 1, wherein the second predetermined number of columns corresponding to the test data input line or/and the test data output line of the checking circuit is lower than the first predetermined number of columns corresponding to the data input line or/and the data output line of the data input/output circuit.

4. The semiconductor data storing circuit device according to claim 3, further comprising:
    a spare memory cell array which is arranged in the memory core to relieve the memory cell array from a defective memory cell placed at an arbitrary column of the memory cell array and in which the number of columns is equal to N times (N is a positive integral number) of the number of columns corresponding to each bit of test data in the checking circuit; and
    a change-over circuit for changing a block of columns of the memory cell array, which includes a defective memory cell and of which the column number is equal to the number of columns corresponding to each bit of data in the checking circuit, to a block of columns of the spare memory cell array.

5. A semiconductor data storing circuit device, which has a plurality of memory cores on a semiconductor chip, comprising:
    a memory cell array which is arranged in each memory core and has a plurality of memory cells arranged in a row or a plurality of rows and a plurality of columns;
    a data input/output circuit which is arranged in each memory core to be used in a normal operation of the memory cell array of the memory core and in which a data input line or/and a data output line for each bit of data is/are arranged at every arbitrary number of columns of the memory cell array; and
    a checking circuit which is arranged in each memory core to be used in a test operation performed in manufacturing of the memory cell array of the memory core and in which a test data input line or/and a test data output line for each bit of test data is/are arranged at every predetermined number of columns of the memory cell array on condition that the predetermined number of columns is common to the memory cores regardless of the arbitrary number of columns corresponding to the data input line or/and the data output line for each bit of data in the data input/output circuit of the memory core.

6. The semiconductor data storing circuit device according to claim 5, wherein the number of rows and the number of columns in the memory cell array of each memory core are the same as those in the memory cell arrays of the other memory cores, and the arbitrary number of columns corresponding to the data input line or/and the data output line for each bit of data in the data input/output circuit of each memory core differs from the arbitrary number of columns in the data input/output circuits of the other memory cores.

7. The semiconductor data storing circuit device according to claim 5, wherein the memory cores are classified into a plurality of types of memory cores, a combination of the number of rows and the number of columns in the memory cell array of each memory core of one type differs from combinations of the numbers of rows and the numbers of columns in the memory cell arrays of the other memory cores of the type for each type of memory cores, the data input line or/and the data output line for each bit of data is/are arranged at every arbitrary number of columns of the memory cell array in each data input/output circuit of one type of memory cores for each type of memory cores, and the test data input line or/and the test data output line for each bit of test data is/are arranged in each checking circuit of one type of memory cores every predetermined number of columns of the memory cell array for each type of memory cores on condition that the predetermined number of columns is common to one type of the memory cores regardless of the arbitrary number of columns in the corresponding data input/output circuit for each type of memory cores.

8. The semiconductor data storing circuit device according to claim 5, wherein a combination of the number of rows and the number of columns in the memory cell array of each memory core differs from combinations of the numbers of rows and the numbers of columns in the memory cell arrays of the other memory cores.

9. The semiconductor data storing circuit device according to claim 8, further comprising:
a spare memory cell array which is arranged in each memory core to relieve the memory cell array of the memory core from a defective memory cell placed at an arbitrary column of the memory cell array and in which the number of columns is equal to N times (N is a positive integral number) of the number of columns corresponding to each bit of test data in the checking circuit.

10. A semiconductor data storing circuit device, comprising:
a memory cell array which is arranged in a memory core of a semiconductor chip and has a plurality of memory cells arranged in a row or a plurality of rows and a plurality of columns;
a data input/output circuit which is arranged in the memory core to be used in a normal operation of the memory cell array and in which a data input line or/and a data output line for each bit of data is/are arranged at every first predetermined number of columns of the memory cell array;
a checking circuit which is arranged in the memory core to be used in a test operation performed in manufacturing of the memory cell array and in which a test data input line or/and a test data output line for each bit of test data is/are arranged at every second predetermined number of columns of the memory cell array;
a spare memory cell array which is arranged in the memory core to relieve the memory cell array from a defective memory cell placed at an arbitrary column of the memory cell array and in which the number of columns is equal to the number of columns corresponding to each bit of test data in the checking circuit; and
a change-over circuit for changing a block of columns of the memory cell array, which includes a defective memory cell and of which the column number is equal to the number of columns corresponding to each bit of data in the data input/output circuit, to a block of columns of the spare memory cell array.

11. A semiconductor data storing circuit device, comprising:
a memory cell array which is arranged in a memory core of a semiconductor chip and has a plurality of memory cells arranged in a row or a plurality of rows and a plurality of columns;
a data input/output circuit which is arranged in the memory core to be used in a normal operation of the memory cell array and in which a data input line or/and a data output line for each bit of data is/are arranged at every first predetermined number of columns of the memory cell array;
a checking circuit which is arranged in the memory core to be used in a test operation performed in manufacturing of the memory cell array and in which a test data input line or/and a test data output line for each bit of test data is/are arranged at every second predetermined number of columns of the memory cell array;
a spare memory cell array which is arranged in the memory core to relieve the memory cell array from a defective memory cell placed at an arbitrary column of the memory cell array and in which the number of columns is equal to the number of columns corresponding to each bit of test data in the checking circuit;
a plurality of first change-over circuits, which are directly connected with the memory cell array, for respectively changing over from one column of the memory cell array to another column of the memory cell array in the normal operation; and
a second change-over circuit for changing a block of columns of the memory cell array, which includes a defective memory cell and of which the column number is equal to the number of columns processed in each first change-over circuit, to a block of columns of the spare memory cell array.

12. A method of checking a semiconductor data storing circuit device, comprising the steps of:
preparing a memory cell array which is arranged in a memory core of a semiconductor chip and has a plurality of memory cells arranged in a row or a plurality of rows and a plurality of columns;
preparing a data input/output circuit which is arranged in the memory core and in which a data input line or/and a data output line for each bit of data is/are arranged at every first predetermined number of columns of the memory cell array;
preparing a checking circuit which is arranged in the memory core and in which a test data input line or/and a test data output line for each bit of test data is/are arranged at every second predetermined number of columns of the memory cell array on condition that the second predetermined number of columns differs from the first predetermined number of columns; and performing a test operation for the memory cell array through the test data input lines or/and the test data output lines of the checking circuit to perform a normal operation for the memory cell array through the data input lines or/and the data output lines of the data input/output circuit.

13. A method of checking a semiconductor data storing circuit device, comprising the steps of:

preparing a memory cell array which is arranged in each of a plurality of memory cores of a semiconductor chip and has a plurality of memory cells arranged in a row or a plurality of rows and a plurality of columns;

preparing a data input/output circuit which is arranged in each memory core and in which a data input line or/and a data output line for each bit of data is/are arranged at every arbitrary number of columns of the memory cell array of the memory cell;

preparing a checking circuit which is arranged in each memory core and in which a test data input line or/and a test data output line for each bit of test data is/are arranged at every predetermined number of columns of the memory cell array on condition that the predetermined number of columns is common to the memory cores regardless of the arbitrary number of columns corresponding to the data input line or/and the data output line for each bit of data in the data input/output circuit of the memory core; and performing a test operation for the memory cell array of each memory core through the test data input lines or/and the test data output lines of the checking circuit of the memory core to perform a normal operation for the memory cell array of the memory core through the data input lines or/and the data output lines of the data input/output circuit of the memory core.

14. The method of checking a semiconductor data storing circuit device according to claim 13, wherein the number of rows and the number of columns in the memory cell array of each memory core are the same as those in the memory cell arrays of the other memory cores, and the arbitrary number of columns corresponding to the data input line or/and the data output line for each bit of data in the data input/output circuit of each memory core differs from the arbitrary number of columns in the data input/output circuits of the other memory cores.

15. The method of checking a semiconductor data storing circuit device according to claim 13, wherein a combination of the number of rows and the number of columns in the memory cell array of each memory core differs from combinations of the numbers of rows and the numbers of columns in the memory cell arrays of the other memory cores.

16. The method of checking a semiconductor data storing circuit device according to claim 13, further comprising the step of classifying the memory cores into a plurality of types of memory cores, wherein a combination of the number of rows and the number of columns in the memory cell array of each memory core of one type differs from combinations of the numbers of rows and the numbers of columns in the memory cell arrays of the other memory cores of the type for each type of memory cores, the data input line or/and the data output line for each bit of data is/are arranged at every arbitrary number of columns of the memory cell array in each data input/output circuit of one type of memory cores for each type of memory cores, and the test data input line or/and the test data output line for each bit of test data is/are arranged in each checking circuit of one type of memory cores every predetermined number of columns of the memory cell array for each type of memory cores on condition that the predetermined number of columns is common to one type of the memory cores regardless of the arbitrary number of columns in the corresponding data input/output circuit for each type of memory cores.

17. A method of relieving the semiconductor data storing circuit device from a defective memory cell, comprising the steps of:

preparing a memory cell array which is arranged in a memory core of a semiconductor chip and has a plurality of memory cells arranged in a row or a plurality of rows and a plurality of columns;

preparing a data input/output circuit which is arranged in the memory core and in which a data input line or/and a data output line for each bit of data is/are arranged at every first predetermined number of columns of the memory cell array;

preparing a checking circuit which is arranged in the memory core and in which a test data input line or/and a test data output line for each bit of test data is/are arranged at every second predetermined number of columns of the memory cell array;

preparing a spare memory cell array which is arranged in the memory core and in which the number of columns is equal to the number of columns corresponding to each bit of test data in the checking circuit;

performing a test operation for the memory cell array of each memory core through the test data input lines or/and the test data output lines of the checking circuit of the memory core to detect a defective memory cell placed at an arbitrary column of one memory cell array; and changing a block of columns of the memory cell array, which includes a defective memory cell and of which the column number is equal to the number of columns corresponding to each bit of data in the data input/output circuit, to a block of columns of the spare memory cell array to relieve the memory cell array from the defective memory cell in cases where the defective memory cell placed at the block of columns of the memory cell array is detected according to the test operation.

18. A method of relieving the semiconductor data storing circuit device from a defective memory cell, comprising the steps of:

preparing a memory cell array which is arranged in a memory core of a semiconductor chip and has a plurality of memory cells arranged in a row or a plurality of rows and a plurality of columns;

preparing a data input/output circuit which is arranged in the memory core and in which a data input line or/and a data output line for each bit of data is/are arranged at every first predetermined number of columns of the memory cell array;

preparing a checking circuit which is arranged in the memory core and in which a test data input line or/and a test data output line for each bit of test data is/are arranged at every second predetermined number of columns of the memory cell array;

preparing a spare memory cell array which is arranged in the memory core and in which the number of columns is equal to the number of columns corresponding to each bit of test data in the checking circuit;

preparing a plurality of first change-over circuits, which are directly connected with the memory cell array, for respectively changing over from one column of the memory cell array to another column of the memory cell array;

performing a test operation for the memory cell array through the test data input lines or/and the test data output lines of the checking circuit to detect a defective memory cell placed at an arbitrary column of the memory cell array; and changing a block of columns of the memory cell array, which includes a defective memory cell and of which the column number is equal to the number of columns processed in each first change-over circuit, to a block of columns of the spare memory cell array to relieve the memory cell array from the defective memory cell in cases where the defective memory cell placed at the block of columns of the memory cell array is detected according to the test operation.

19. A method of relieving the semiconductor data storing circuit device from a defective memory cell, comprising the steps of:

preparing a memory cell array which is arranged in a memory core of a semiconductor chip and has a plurality of memory cells arranged in a row or a plurality of rows and a plurality of columns;

preparing a data input/output circuit which is arranged in the memory core and in which a data input line or/and a data output line for each bit of data is/are arranged at every first predetermined number of columns of the memory cell array;

preparing a checking circuit which is arranged in the memory core and in which a test data input line or/and a test data output line for each bit of test data is/are arranged at every second predetermined number of columns of the memory cell array on condition that the second predetermined number of columns is lower than the first predetermined number of columns;

preparing a spare memory cell array which is arranged in the memory core and in which the number of columns is equal to N times (N is a positive integral number) of the number of columns corresponding to each bit of test data in the checking circuit;

performing a test operation for the memory cell array through the test data input lines or/and the test data output lines of the checking circuit to detect a defective memory cell placed at an arbitrary column of the memory cell array; and changing a block of columns of the memory cell array, which includes a defective memory cell and of which the column number is equal to the number of columns corresponding to each bit of data in the checking circuit, to a block of columns of the spare memory cell array to relieve the memory cell array from the defective memory cell in cases where the defective memory cell placed at the block of columns of the memory cell array is detected according to the test operation.

20. A method of relieving the semiconductor data storing circuit device from a defective memory cell, comprising the steps of:

preparing a memory cell array which is arranged in each of a plurality of memory cores of a semiconductor chip and has a plurality of memory cells arranged in a row or a plurality of rows and a plurality of columns on condition that a combination of the number of rows and the number of columns in the memory cell array of each memory core differs from combinations of the numbers of rows and the numbers of columns in the memory cell arrays of the other memory cores;

preparing a data input/output circuit which is arranged in each memory core and in which a data input line or/and a data output line for each bit of data is/are arranged at every arbitrary number of columns of the memory cell array of the memory cell;

preparing a checking circuit which is arranged in each memory core and in which a test data input line or/and a test data output line for each bit of test data is/are arranged at every predetermined number of columns of the memory cell array on condition that the predetermined number of columns is common to the memory cores regardless of the arbitrary number of columns corresponding to the data input line or/and the data output line for each bit of data in the data input/output circuit of the memory core;

preparing a spare memory cell array which is arranged in each memory core and in which the number of columns is equal to N times (N is a positive integral number) of the number of columns corresponding to each bit of test data in the checking circuit; and relieving the memory cell array of a specific memory core from a defective memory cell by using the spare memory cell array in cases where the defective memory cell exists in the memory cell array of the specific memory core.

* * * * *